US008947838B2

United States Patent
Yamai et al.

(10) Patent No.: US 8,947,838 B2
(45) Date of Patent: Feb. 3, 2015

(54) OVERCURRENT FAULT DETECTION DEVICE FOR ELECTRICAL DRIVE CONTROL SYSTEM

(75) Inventors: Hiroyuki Yamai, Hitachinaka (JP); Yasuo Noto, Hitachinaka (JP); Yoshio Akaishi, Hitachinaka (JP); Kohei Myoen, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 703 days.

(21) Appl. No.: 13/213,274

(22) Filed: Aug. 19, 2011

(65) Prior Publication Data

US 2012/0050922 A1 Mar. 1, 2012

(30) Foreign Application Priority Data

Aug. 31, 2010 (JP) .................................. 2010-194067

(51) Int. Cl.
H02H 5/04 (2006.01)
H02H 7/08 (2006.01)
H02P 29/02 (2006.01)

(52) U.S. Cl.
CPC .................................... *H02P 29/022* (2013.01)
USPC ................................................ 361/31; 361/23

(58) Field of Classification Search
CPC ....... H02H 7/085; H02H 7/0833; H02H 7/08; H02H 7/093
USPC ..................................................... 361/23, 31
See application file for complete search history.

(56) References Cited

U.S. PATENT DOCUMENTS 4,968,338 A * 11/1990 Sugiyama ........................ 62/126
6,009,003 A * 12/1999 Yeo .................................. 363/37
7,723,964 B2 * 5/2010 Taguchi ........................ 323/222
(Continued)

FOREIGN PATENT DOCUMENTS

JP 61-98188 A 5/1986
JP 63-169536 A 7/1988
(Continued)

OTHER PUBLICATIONS

European Search Report dated Dec. 29, 2011 (Six (6) pages).
(Continued)

*Primary Examiner* — Eduardo Colon Santana
*Assistant Examiner* — Gabriel Agared
(74) *Attorney, Agent, or Firm* — Crowell & Moring LLP

(57) ABSTRACT

According to the present invention, an overcurrent fault detection device includes: an inverter converting DC current to three-phase AC currents for driving a motor; a DC voltage detector; phase current detectors; a rotational position detector that detects a rotational angle of the motor; a control circuit that controls a gate drive circuit, which controls the inverter at every predetermined cycle, based upon the phase current values, a motor rotational angle detection value, and a speed command or a torque command from a higher-order control device; and a first decision-making circuit that detects an overcurrent based upon the phase current values at every predetermined cycle, wherein: the first decision-making circuit determines whether or not the phase current values exceed a predetermined amplitude threshold value by frequency detection for any of the phase current values exceeding the predetermined amplitude threshold value, and determines that an overcurrent has occurred upon detecting the frequency.

9 Claims, 21 Drawing Sheets

(56) References Cited

U.S. PATENT DOCUMENTS

| | | | |
|---|---|---|---|
| 2007/0187718 A1* | 8/2007 | Suzuki et al. | 257/194 |
| 2008/0130336 A1* | 6/2008 | Taguchi | 363/125 |
| 2008/0151583 A1* | 6/2008 | Matsumoto | 363/34 |
| 2009/0108794 A1* | 4/2009 | Ochiai et al. | 318/760 |

FOREIGN PATENT DOCUMENTS

| | | |
|---|---|---|
| JP | 4-50667 A | 2/1992 |
| JP | 4-129494 A | 4/1992 |
| JP | 7-221613 A | 8/1995 |
| JP | 10-14094 A | 1/1998 |
| JP | 10-42569 A | 2/1998 |
| JP | 2002-199744 A | 7/2002 |
| JP | 2003-79183 A | 3/2003 |
| JP | 2006-322932 A | 11/2006 |
| JP | 2008-61462 A | 3/2008 |
| JP | 2010-16982 A | 1/2010 |
| WO | WO 97/14205 A1 | 4/1997 |
| WO | WO 2006/069568 A1 | 7/2006 |

OTHER PUBLICATIONS

Japanese-language Office Action dated Jan. 22, 2013 including English language translation (Seven 97) pages).

* cited by examiner

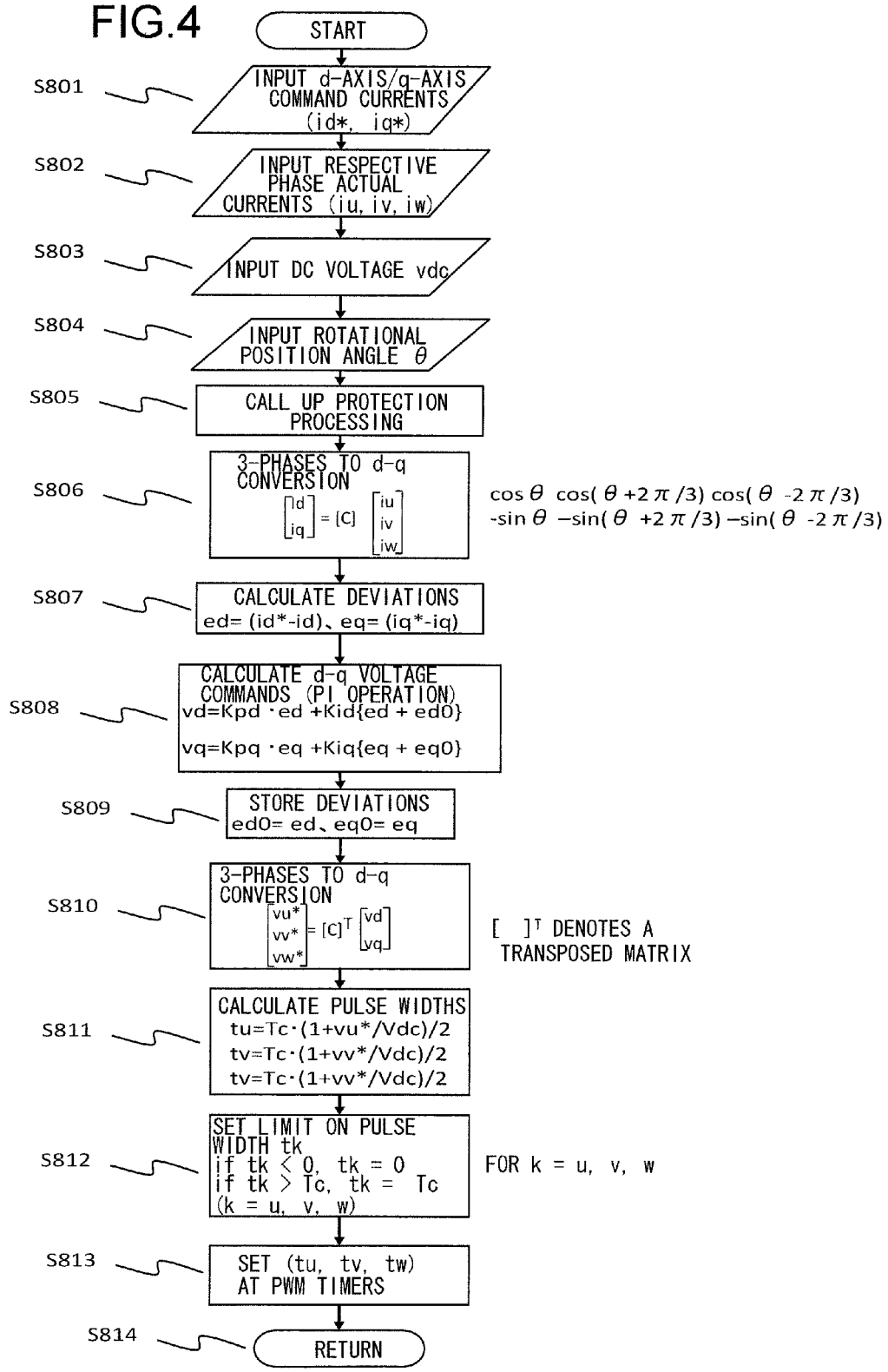

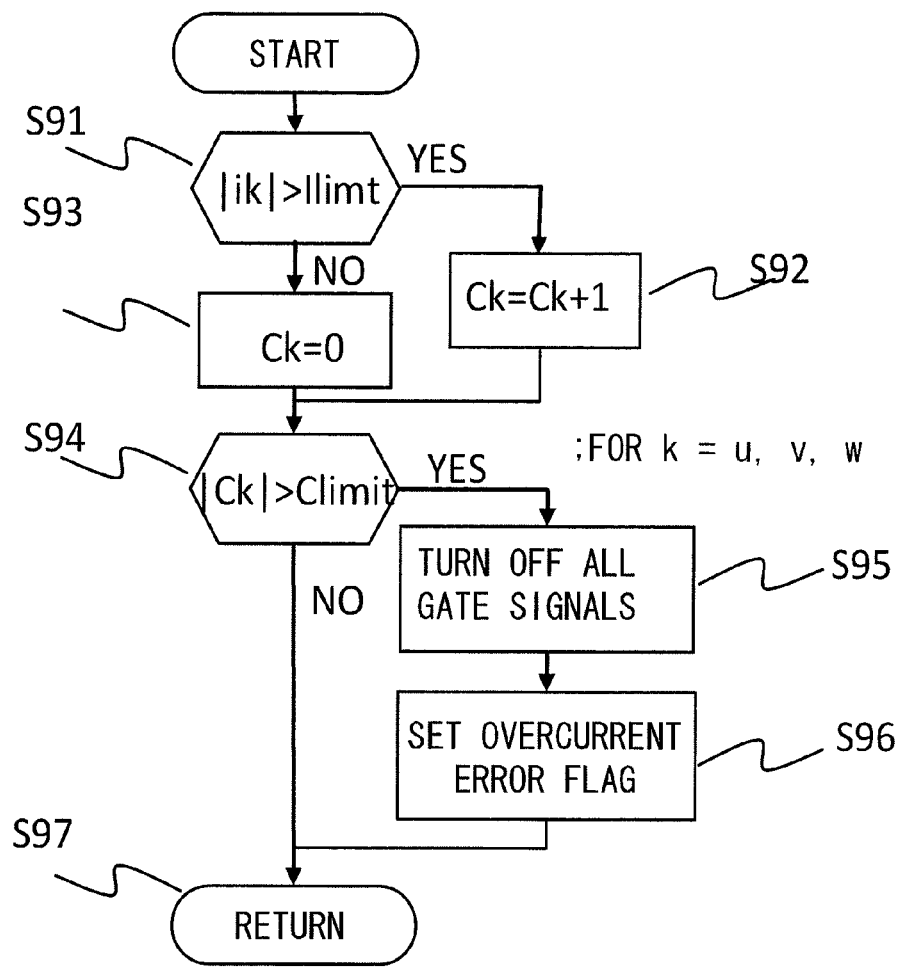

POWER SHORT-CIRCUIT

GROUND FAULT

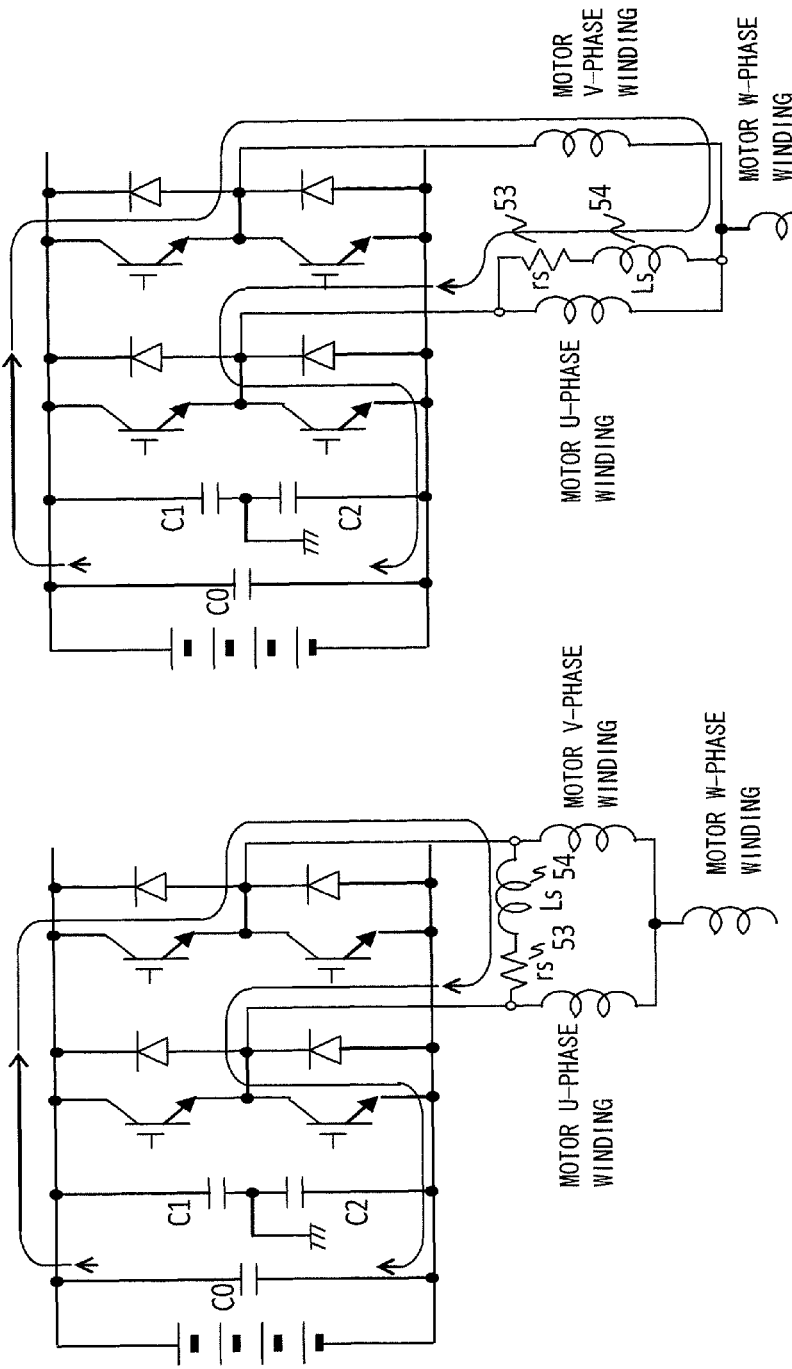

$$C1 + \frac{C2 \cdot C0}{C2+C0} \approx 2 \cdot C1$$

MOTOR U-PHASE WINDING

MOTOR U-PHASE WINDING

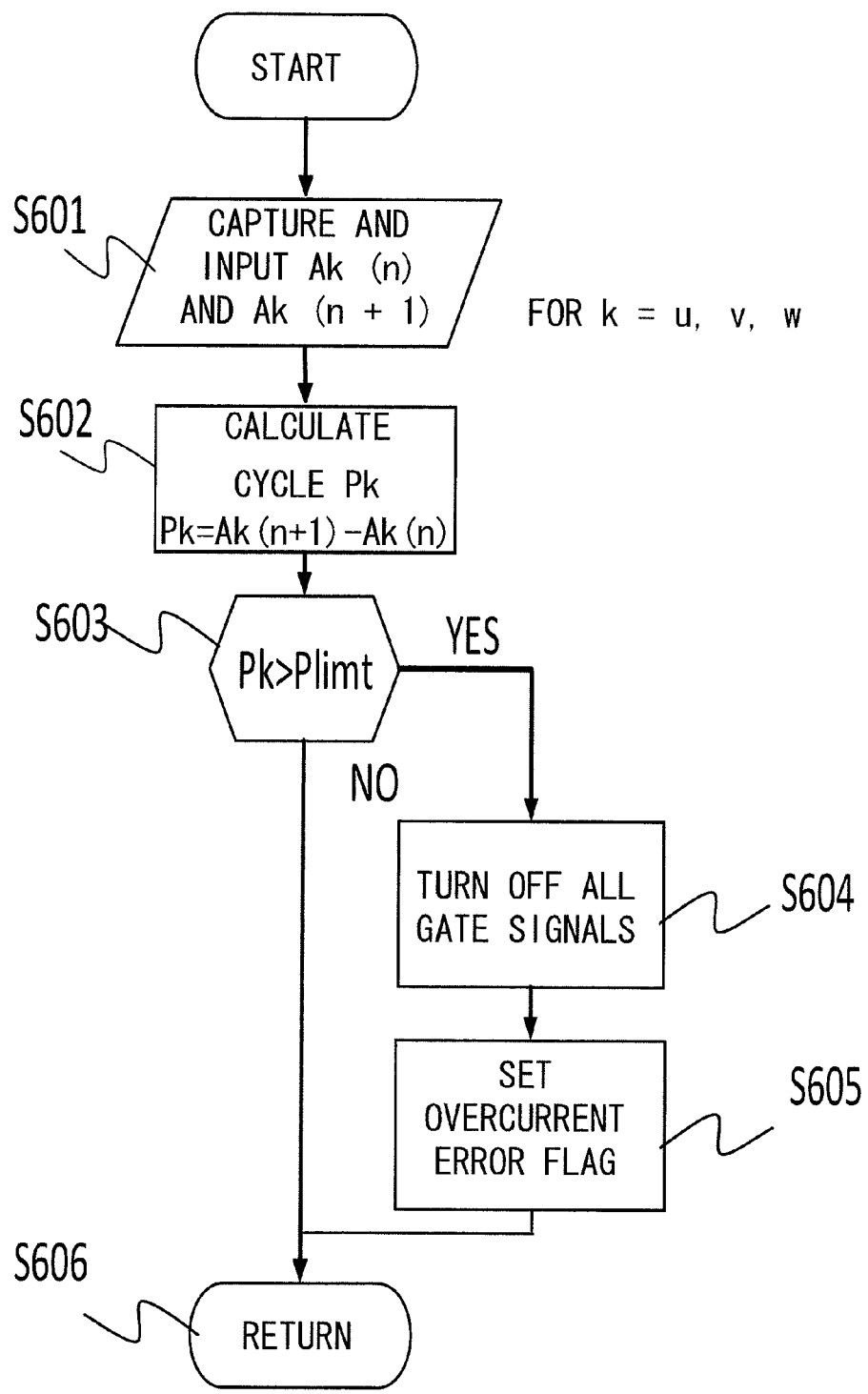

TYPE 1

TYPE 2

TYPE 3

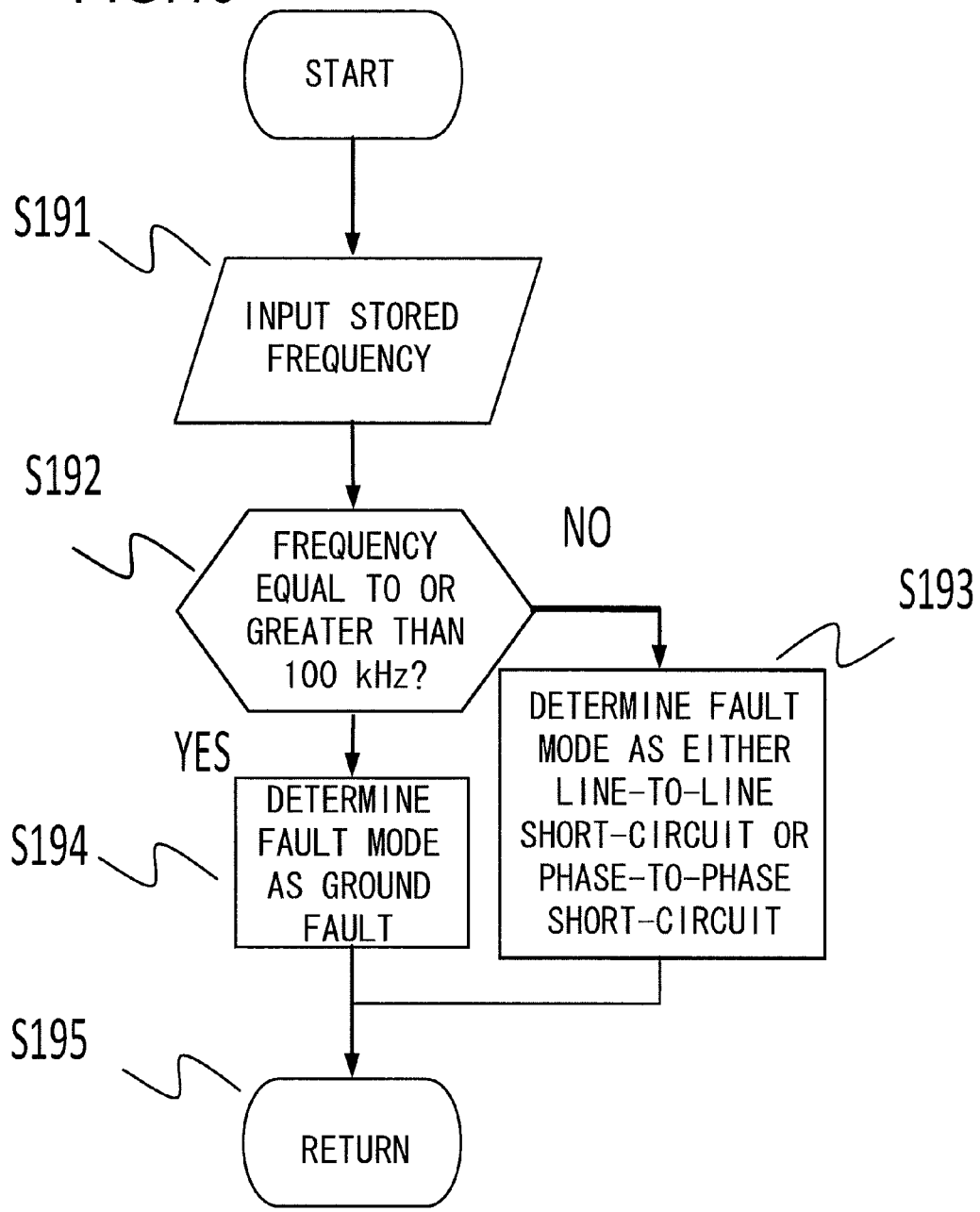

OVERCURRENT FAULT DETECTION DEVICE FOR ELECTRICAL DRIVE CONTROL SYSTEM

INCORPORATION BY REFERENCE

The disclosure of the following priority application is herein incorporated by reference: Japanese Patent Application No. 2010-194067 filed Aug. 31, 2010

BACKGROUND OF THE INVENTION

1. Field of the Invention

The present invention relates to a device that detects an overcurrent attributable to a short-circuit abnormality occurring in an electrical drive control system and a detection method adopted in the device.

2. Description of Related Art

An electrical drive control system of a hybrid electric vehicle or an electric vehicle achieves variable-speed drive of an AC motor by utilizing a power conversion device constituted with a voltage inverter (referred to simply as an "inverter" in the following description of the invention) which converts a DC voltage to an AC voltage. Such an inverter is equipped with an fault detection circuit for detecting, for instance, an overcurrent.

If, for instance, an output ground fault attributable to electrically conductive foreign matter, or line-to-line short-circuit or phase-to-phase short-circuit attributable to a dielectric breakdown occurring inside the motor connected to the electrical drive control system occurs on the output side of the inverter in the electrical drive control system, the amplitude of a current output from the inverter will increase quickly, and an overcurrent state comes up in the electrical drive control system, in which a current exceeding the maximum rated continuous current or the short-time rated current of the transistors constituting the inverter flows.

The inverter disclosed in Japanese Laid Open Patent Publication No. S 61-98188 determines that an overcurrent has occurred upon detecting a current exceeding a predetermined threshold value.

SUMMARY OF THE INVENTION

When the inverter and its peripheral circuits are in a fault mode, such as any of those in (1) to (3) below, an overcurrent in the inverter output may be caused by LCR resonance assuming a frequency in a range of several kHz through a frequency exceeding 100 kHz and in such a case, the inverter may output an electric current that includes an oscillating current attributable to the resonance superposed on the current (low-frequency current) corresponding to a command current.

(1) Output ground fault/top fault
(2) Output line-to-line short-circuit
(3) Output phase-to-phase short-circuit An oscillating current with a high frequency occurring in the fault modes (1) to (3) cannot be accurately detected through the processing disclosed in patent literature 1 executed by the microcomputer by sampling the current value with a sampling cycle of approximately 10 kHz. In addition, it may also be difficult to accurately detect an overcurrent even with a comparator and a method as disclosed in Japanese Laid Open Patent Publication No. S 61-98188, in which it is determined that an overcurrent has occurred if the current amplitude exceeds a predetermined threshold value.

According to the 1st aspect of the present invention, an overcurrent fault detection device, comprises: an inverter that converts a DC current to three-phase AC currents in order to drive a motor; a DC voltage detector that detects a DC voltage value of a DC voltage flowing to the inverter; phase current detectors that detect respective phase current values of the three-phase AC currents; a rotational position detector that detects a rotational angle of the motor; a control circuit that controls a gate drive circuit, which controls output currents of the inverter at every predetermined cycle, based upon the phase current values provided by the phase current detectors, a motor rotational angle detection value provided by the rotational position detector and a speed command or a torque command issued by a higher-order control device; and a first decision-making circuit that detects an overcurrent based upon the phase current values detected by the phase current detectors at every predetermined cycle, wherein: the first decision-making circuit determines whether or not the phase current values exceed a predetermined amplitude threshold value by carrying out frequency detection for any of the phase current values exceeding the predetermined amplitude threshold value, and determines that an overcurrent has occurred upon detecting the frequency.

According to the 2nd aspect of the present invention, an overcurrent fault detection device according to the 1st aspect, further comprises: a second decision-making circuit that detects an overcurrent in the every predetermined cycle, wherein: the second decision-making circuit determines that an overcurrent has occurred if any of the phase current values detected by the phase current detectors exceeds a predetermined amplitude threshold value.

According to the 3rd aspect of the present invention, in an overcurrent fault detection device according to the 1st aspect, it is preferred that the first decision-making circuit includes a comparator with hysteresis provided with a predetermined hysteresis width, which carries out the frequency detection for any of the phase current values.

According to the 4th aspect of the present invention, in an overcurrent fault detection device according to the 3rd aspect, it is preferred that the first decision-making circuit further includes a hysteresis central value altering circuit that adjusts a hysteresis center assumed by the comparator with hysteresis in correspondence to a predetermined current value.

According to the 5th aspect of the present invention, in an overcurrent fault detection device according to the 3rd aspect, it is preferred that the first decision-making circuit further includes a subtractor circuit that subtracts a predetermined current value from any of the phase current values and inputs subtraction results; and an output from the subtractor circuit is input to the comparator with hysteresis.

According to the 6th aspect of the present invention, in an overcurrent fault detection device according to the 4th or 5th aspect, it is preferred that the first decision-making circuit further includes a sample hold; and any of the phase current values held by the sample hold at a predetermined time interval is used as the predetermined current value.

According to the 7th aspect of the present invention, in an overcurrent fault detection device according to the 4th or 5th aspect, it is preferred that a command current value is used as the predetermined current value.

According to the 8th aspect of the present invention, an overcurrent fault detection device according to any one of the 3rd through 7th aspects, further comprises: counters that count numbers of times of exceeding a predetermined amplitude for the phase current values respectively, by counting changes in output from the comparator with hysteresis, wherein: the first decision-making circuit determines that an overcurrent has occurred upon detecting that any of the phase current values takes on a frequency of which amplitude exceeds a predetermined amplitude, based upon a count value having been counted on the counters.

According to the 9th aspect of the present invention, an overcurrent fault detection device according to any one of the 3rd through 7th aspects, further comprises: a capture that detects a rising edge position and a falling edge position of a pulse output from the comparator with hysteresis; and a free-run counter, wherein: the first decision-making circuit detects that a cycle length of any of the phase current values exceeding a predetermined amplitude based upon the rising edge position and the falling edge position of the pulse, and detects a frequency of any of the phase current values exceeding the predetermined amplitude based upon the cycle length.

According to the 10th aspect of the present invention, in an overcurrent fault detection device according to any one of the 1st and 3rd through 9th aspects, it is preferred that a cause of an overcurrent fault occurring in an electrical drive control system is determined, based upon a frequency of any of the phase current values exceeding the predetermined amplitude, which is detected by the first decision-making circuit.

According to the 11th aspect of the present invention, in an overcurrent fault detection device according to any one of the 1st through 10th aspects, it is preferred that gate signals for transistors at the inverter are turned off so as to protect the transistors upon determining that an overcurrent has occurred.

BRIEF DESCRIPTION OF THE DRAWINGS

FIG. 4 presents a flowchart of microcomputer processing that may be executed for purposes of current control in the electrical drive control system.

FIG. 5 presents a flowchart of microcomputer processing that may be executed for overcurrent fault detection in the prior art.

FIGS. 6A through 6D are circuit diagrams respectively showing how a ground fault, a power short-circuit, line-to-line short-circuit and phase-to-phase short-circuit may occur in the electrical drive control system.

FIG. 14 presents a flowchart of the overcurrent fault detection processing according to the present invention executed by the control circuit shown in FIG. 12.

FIG. 19 presents a flowchart of determining process for the cause of overcurrent according to the present invention.

DESCRIPTION OF PREFERRED EMBODIMENTS

Before describing embodiments of the present invention in reference to the drawings, the overall operations of an electrical drive control system that includes a control circuit equipped with the overcurrent fault detection device according to the present invention, an inverter circuit and a motor and how an overcurrent may occur due to a fault in the electrical drive control system are explained so as to clearly highlight the object of the present invention.

Operations of the Electrical Drive Control System and how an Overcurrent Occurs

Figure 1:
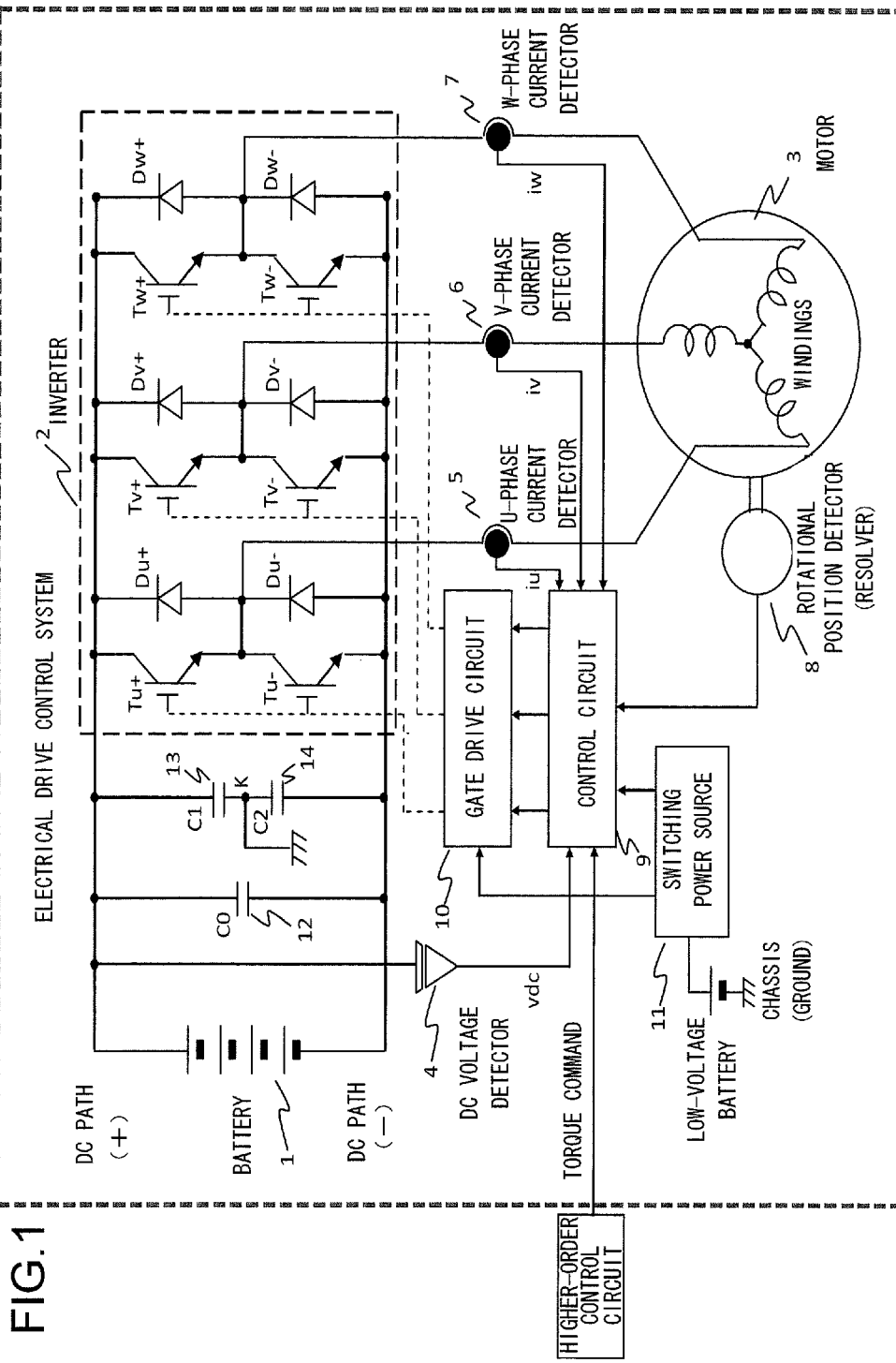
FIG. 1 is a diagram showing the overall structure of the electrical drive control system achieved in an embodiment of the present invention, which includes a control circuit equipped with the overcurrent fault detection device according to the present invention.

FIG. 1 is a schematic diagram showing the overall structure of the electrical drive control system. The electrical drive control system comprises a battery 1, an inverter 2, an AC motor 3, a DC input voltage detector 4, a U-phase current detector 5, a V-phase current detector 6, a W-phase current detector 7, a rotational angle detector 8, a control circuit 9, a gate drive circuit 10 and a power source 11 that provides power needed for control and gate drive. Upon receiving a speed command or a torque command, issued by an external higher-order control device based upon vehicle driver actions and vehicle conditions, the electrical drive control system controls the gate drive circuit for controlling the U-phase, V-phase, and W-phase currents being supplied from the inverter circuit 2 to the motor so as to generate a rotational torque needed by the motor 3 based upon a DC voltage value vdc provided by the DC voltage detector 4, a U-phase current value iu, a V-phase current value iv and a W-phase current value iw respectively provided by the current detectors 5, 6 and 7 and the rotational position angle indicating the rotational position of the motor rotor provided by the rotational position detector 8.

It is to be noted that the DC voltage value vdc, the phase current values iu, iv and iw and the rotational position angle mentioned above are each output actually as a voltage of, for instance, 0 to 5V from the corresponding detector and input to the control circuit 9. In addition, in the following explanation of the operations of the control circuit 9, the DC voltage value vdc, the phase current values iu, iv and iw, the rotational position angle and other current values and voltage values input to the control circuit 9 are all referred to as corresponding voltage values of 0 to 5V. Furthermore, the subsequent explanation of the processing executed by the microcomputer included in the control circuit is provided by assuming that these values are digital values achieved through A/D conversion of the corresponding 0 to 5V voltages. As long as there is no risk of misunderstanding, a current value and a voltage value may be simply referred to as a current and a voltage respectively.

While the high-power transistors (Tu+, Tu−, Tv+, Tv−, Tw+, Tw− in FIG. 1) used in the inverter 2 can be continuously operated at 300 [A] (collector temperature TC=25° C.) in a case of continuous operation (DC operation), a twice as much power, i.e., up to 600 [A], can be supplied in a case of pulsed operation.

Since the high-power transistors used in the inverter are expensive, various protective measures are normally taken by controlling them via a microcomputer. In addition, a current control device is often mounted in a drive source that drives a primary motor in automotive applications. Accordingly, any overcurrent state that may occur in the inverter, too, is detected through sampling and necessary actions are taken through processing executed by the microcomputer as part of the microcomputer control cycle.

Figure 2C:
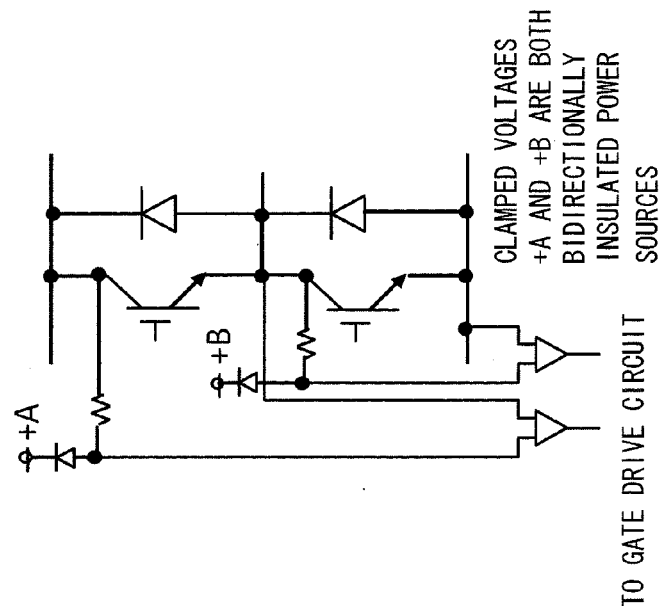
FIGS. 2A to 2C each present an example of an inverter current detection circuit that may be used in a gate protection circuit.
Figure 2B:
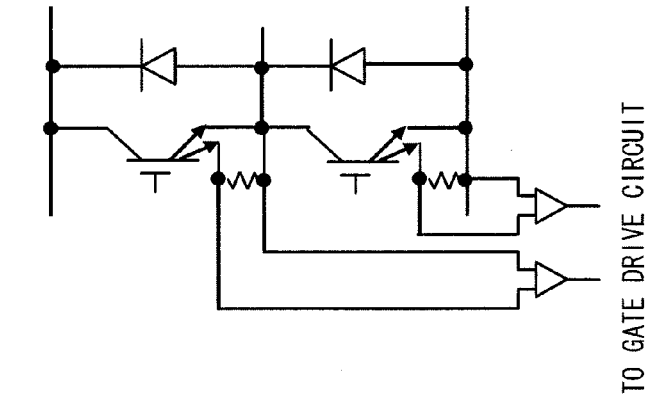
Figure 2A:
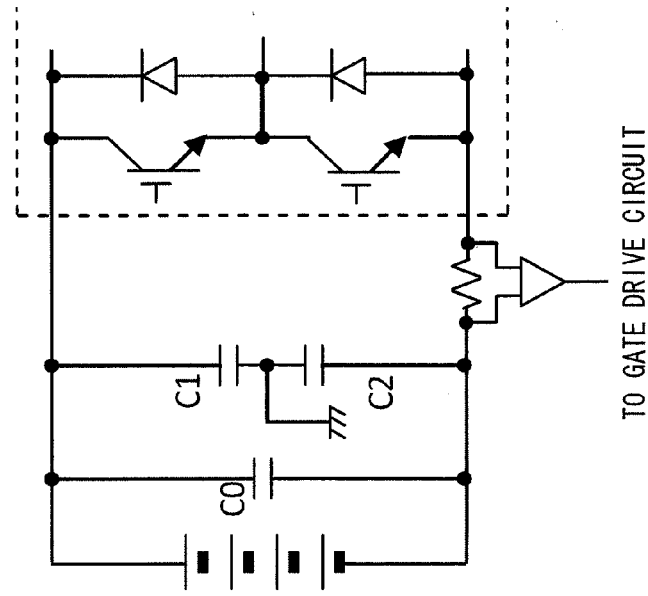

In addition, the inverter gate drive circuit assumes a protective function whereby a gate signal is turned off in reference to a predetermined current threshold value (e.g., 600 [A]) so as to ensure that the inverter is protected with a high degree of reliability. Regarding detection of the current, in place of the current detected in the high power transistors for controlling these, the current may be detected via a shunt resistor disposed in a line located on the negative side of the DC power source, as shown in FIG. 2A, or, when the main current exceeds several hundred Amperes, the current subdivided with multi-emitters in the transistor from the main current may be detected via a shunt resistor, as shown in FIG. 2B, or as an alternative, a collector-emitter voltage at the transistor may be detected and the main current may be indirectly detected based upon the saturation voltage characteristics corresponding to the collector current detected when the transistor is in the ON state, as shown in FIG. 2C. The detection value from any of these detection methods is compared with a predetermined level by a comparator and, depending upon the comparison results, the transistor gate may be turned off.

As shown in FIG. 1, the inverter 2 is constituted with three arms. Each arm is normally made up with two transistors and two diodes, with the collector and the emitter of one transistor respectively connected to the positive side of the battery and the collector of the other transistor. The emitter of the other transistor is grounded on the negative side of the battery. The two diodes are each connected to one of the two transistors, so that the anode and the cathode of each diode are respectively connected in parallel to the emitter and the collector of the corresponding transistor.

The two transistors in each arm enter the ON state mutually exclusively with an off-to-on switchover completed with a delay in order to prevent a short-circuit of the positive and negative power lines from occurring during a time lag elapsing while a transistor enters the OFF state. It is assumed that the processing described above is executed based upon the PWM output signals mentioned in the following description of the present invention.

A C0 capacitor 12 (hereafter referred to as a main capacitor), which absorbs a current ripple occurring at a switchover, and a C1 capacitor 13 and a C2 capacitor 14 provided for noise removal, are all connected to the DC input side of the inverter 2. The C0 capacitor 12 and in-series connected capacitors C1 capacitor 13, C2 capacitor 14 (hereafter, the C1 capacitor and the C2 capacitor may be collectively referred to as a Y capacitor) are connected in parallel between a positive terminal and a negative terminal of the battery. A serial connection point K, at which the C1 capacitor 13 and the C2 capacitor 14 are connected in series, is grounded to the chassis or the like.

The motor 3 includes a stator with three-phase windings disposed at the core thereof. Ends of each phase windings, located on one side, are connected to one another through a Y connection, whereas the other ends of the phase windings are each connected to a connection point at which the emitter of one transistor is connected with the collector of the other transistor in one of the arms constituting the inverter 2. In addition, the motor further includes a rotor that rotates with a specific gap from the stator. While a detailed description is not provided, a rotor in an induction motor includes a secondary winding, whereas a rotor in a synchronous motor includes permanent magnets. In either case, a torque is generated with the electromagnetic force occurring between the rotor and the stator by the currents flowing through the stator windings. The AC output current, i.e., the motor winding current, and the rotor angle position are detected for controlling the output current from the inverter 2 via the control circuit 9, so that a U-phase current, the V-phase current and a W-phase current are supplied imparting a predetermined level of drive force.

While the description above is given by assuming that the inverter supplies a current used to drive the motor, the inverter provides electric currents to be stored into the battery when the vehicle is in a decelerating state and the motor is utilized as a generator (during energy regeneration). While power is stored into the battery under control executed by another control circuit (not shown) that controls battery charge/discharge, an explanation of the battery charge/discharge control is omitted.

Figure 3:
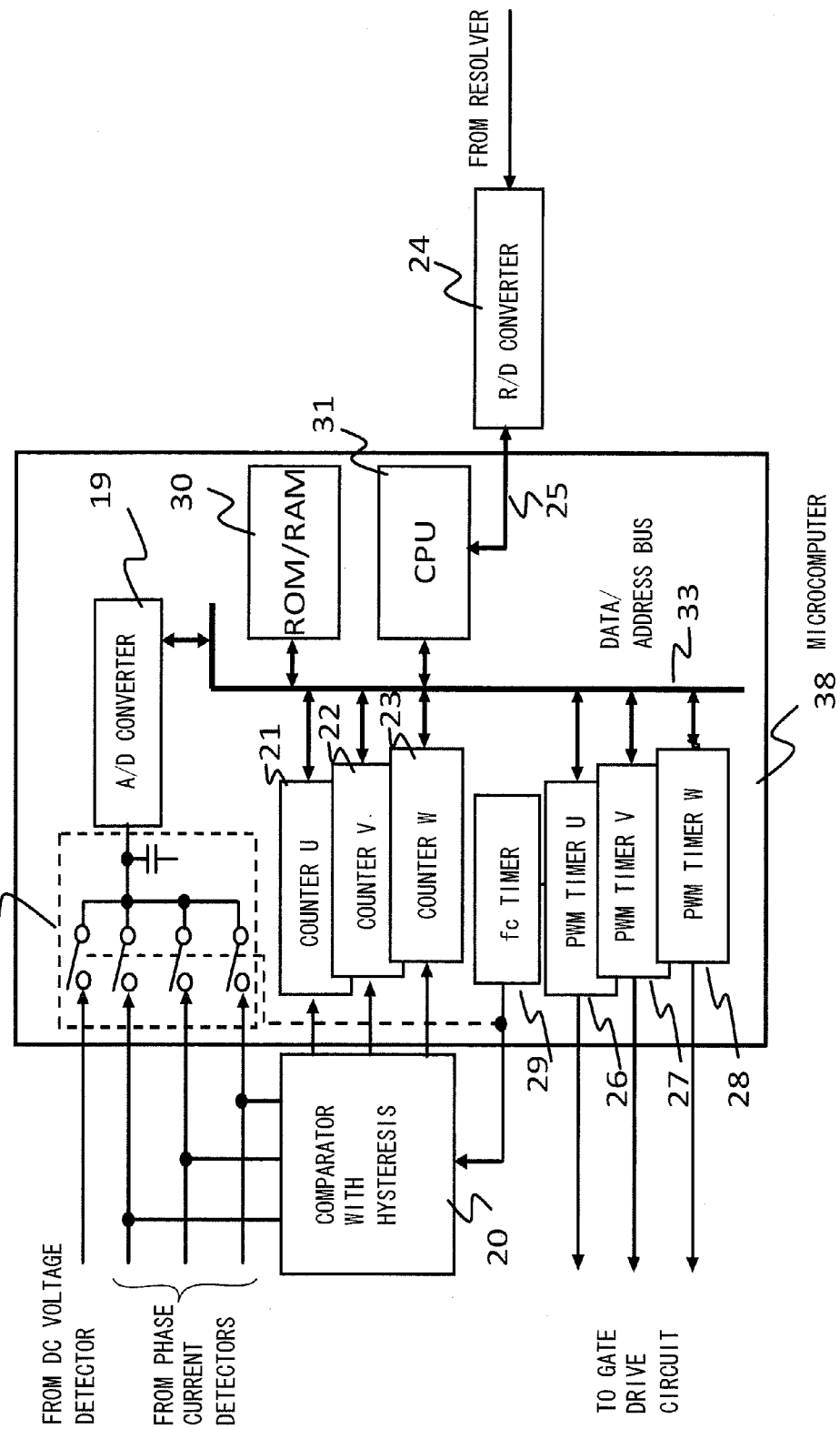
FIG. 3 is a block diagram presenting an example of a structure that may be adopted in the control circuit built into an electrical drive control system embodying the present invention.

FIG. 3 is a block diagram presenting an example of a structure that may be adopted in the control circuit 9 in an embodiment of the present invention. This control circuit 9 has a built-in overcurrent protection function whereby the control circuit determines that an error has occurred if the amplitudes of a phase current value and the DC voltage value exceed a predetermined value and has the gate drive circuit turn off the gate signals for the inverter transistors so as to protect the transistors.

A microcomputer 39 constituting the core of the control circuit 9 in FIG. 3 is built into the control circuit shown in FIG. 1. The outputs (phase current values) from the various phase current detectors are input to a comparator with hysteresis 20 and are also input to an A/D converter 19 in the microcomputer 39 via a multiplexer & sample hold 32 (sampling circuit). In addition, the output (DC voltage value) from the DC voltage detector 4 is input to the A/D converter in the microcomputer 39 via the multiplexer & sample hold 32.

The microcomputer 39 cyclically executes inverter current control and also executes overcurrent protection processing upon determining that an error has occurred whenever the amplitude of a phase current value exceeds a predetermined value as detailed later by sampling the phase current values and the DC voltage value via the multiplexer & sample hold 32.

The microcomputer 39 in the control circuit 9 controlling the output currents as described above may execute the control processing as shown in the flowchart presented in FIG. 4. This processing should be executed over every carrier cycle of the inverter pulse width modulation (hereafter referred to as "PWM").

The following is a description of the inverter current control executed in the embodiment of the present invention, given in reference to FIG. 4. Following the processing start, a d-axis current command id* and a q-axis current command iq*, having been calculated and stored through separate processing, are read from the memory in step S801. In step S802 and step S803, the A/D conversion results of the three-phase output currents iu, iv and iw (see FIG. 1) and the DC voltage vdc are respectively read from specific registers. Then, in step S804, the rotational angle θ is read from an RD converter connected to an external memory data bus 25 of the microcomputer 39.

In step S805, the overcurrent protection processing, which is to be described later, is called up. Subsequently, upon returning to the control processing flow, the operation proceeds to step S806. In step S806, d-axis and q-axis currents (id, iq) are calculated through d-q coordinate conversion executed based upon the 3-phase currents (iu, iv and iw) and the rotational angle θ having been read. Next, in step S807, the actual currents are subtracted from the d-axis command current and the q-axis command current so as to calculate current deviations (ed, eq). In step S808, a d-axis voltage command and a q-axis voltage command are calculated by executing PI arithmetic operation processing as expressed in expression (1) below individually on the d-axis current deviation and the q-axis current deviation.

$$vd = Kpd \cdot ed + Kid\{ed + ed0\}$$

$$vq = Kpq \cdot eq + Kiq\{eq + eq0\} \quad (1)$$

In the expressions above, Kpd and Kpq respectively indicate a d-axis proportional gain and a q-axis proportional gain, and Kid and Kiq respectively indicate a d-axis integral gain and a q-axis integral gain. In addition, ed and eq represent the d-axis current deviation and the q-axis current deviation respectively, whereas ed0 and eq0 respectively indicate the d-axis current deviation and the q-axis current deviation having been determined in the immediately preceding sampling cycle (i.e., when the processing in the flowchart was executed for the previous cycle).

In step S809, the current deviations (ed, eq) are stored as the most recent sample values (ed0, eq0). In step S810, the d-axis and q-axis voltage commands (vd, vq) having been calculated are converted to three-phase voltages (vu*, vv* vw*) based upon the rotational angle θ. Then, in step S811, the voltage commands are converted to pulse widths (tu, tv, tw) as expressed below based upon the DC input voltage vdc and the PWM carrier cycle Tc.

$$tu = Tc \cdot (1 + vu^*/vdc)/2$$

$$tv = Tc \cdot (1 + vv^*/vdc)/2$$

$$tw = Tc \cdot (1 + vw^*/vdc)/2 \quad (2)$$

In step S812, the phase pulse widths corresponding to the individual phases are clamped so as to ensure that they do not deviate beyond a 0 to Tc range. In more specific terms, a negative pulse width is corrected to 0 and any pulse width exceeding Tc is adjusted to Tc. Once the pulse widths resulting from the adjustment are set in the PWM timers at the microcomputer 39 in step S813, the processing ends and the operation returns to the main processing, the flowchart of which is omitted in the drawings.

Next, the overcurrent protection processing is described. First, in reference to the flowchart presented in FIG. 5, an overcurrent fault detection executed in the related art is described. Following the processing start, the three-phase currents having been read in step S802 in FIG. 4 are compared with a predetermined current level (threshold value) in step S91. A current exceeding the predetermined level is judged to be an overcurrent, and in this case, a counter C is incremented in step S92. If, on the other hand, the currents are equal to or less than the predetermined level, the counter is set to 0 in step S93. In step S94, a decision is made as to whether or not the value at the counter has reached a predetermined count value, and if it is decided that the counter value exceeds the predetermined count value, all the transistor elements in the inverter are turned off in step S95, an overcurrent error flag is set in step S96 and then the operation returns to the control processing flow in step S97. If the counter value is equal to or less than the predetermined count value, the operation proceeds to step S97, and returns to the control processing. Once the overcurrent error flag is set, the processing in the flowchart presented in FIG. 4 is suspended until the overcurrent error flag is cleared upon determining that the processing can be restarted by following a predetermined procedure through separate processing (not shown). If no error is detected, the inverter output currents are controlled through the processing sequence indicated in the flowchart presented in FIG. 4 so as to achieve the predetermined command currents.

FIGS. 6A through 6D each present an example of a circuit state that may be assumed in one of the fault modes, (1) output ground fault/power short-circuit, (2) output line-to-line short-circuit and (3) output phase-to-phase short-circuit, in which an overcurrent is likely to be induced. It is to be noted that FIGS. 6A through 6D each show only a part of the inverter that is related to a given fault mode for purposes of simplification. While a fault may involve a plurality of locations and a plurality of arms, an illustration of such a fault is omitted.

Figure 6B:
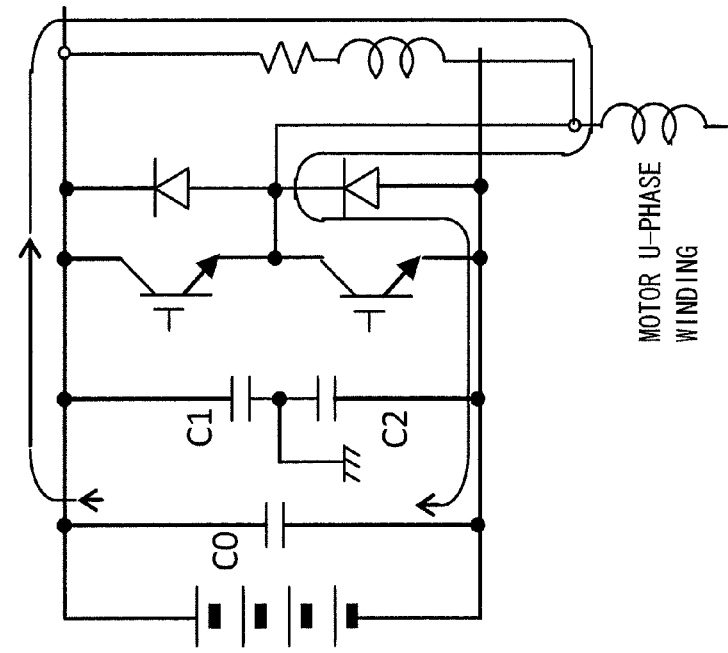
Figure 6A:
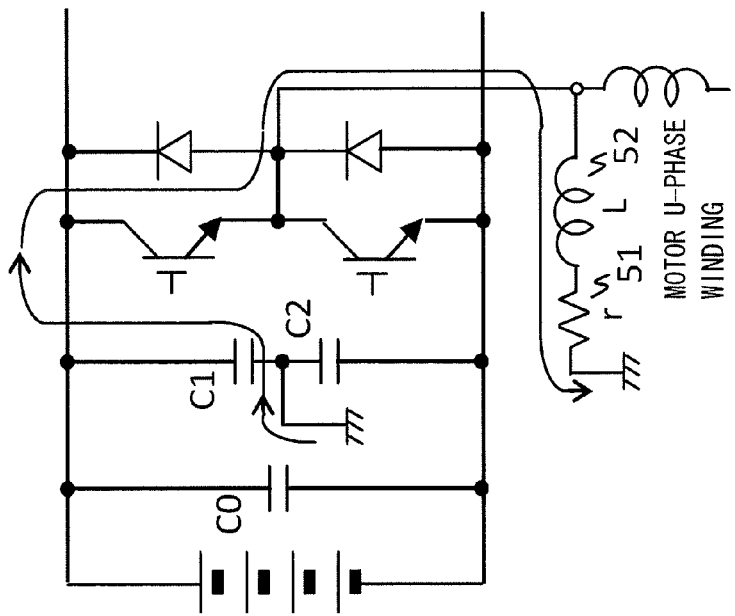

FIG. 6A shows a current flow induced by a ground fault occurring when a transistor located on the upper side of the U-phase arm is in the ON state. An example of an output ground fault is described in further detail below.

Output Ground Fault

Figure 7A:
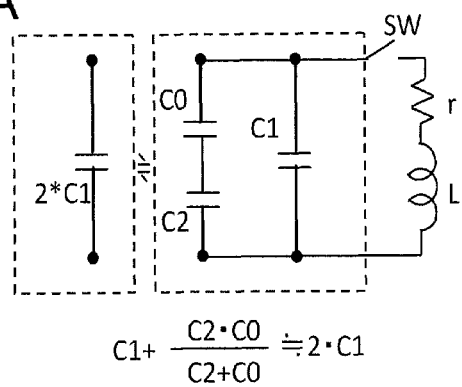
FIGS. 7A through 7C are circuit diagrams showing a ground fault equivalent circuit and the current path through which the electric current will travel in the event of a ground fault in the electrical drive control system.

FIG. 7A shows an output ground fault equivalent circuit. This equivalent circuit is an LCR serial circuit constituted with a Y capacitor (assuming C1=C2), main capacitor C0, and a resistance 51(r) and an inductance 52(L) of a wiring between the ground and the ground fault point. Since the resistance value is small enough and C1 is sufficiently small compared to C0, a condition expressed as $r^2 - 4 L/C < 0$ exists and thus, a resonance current with a frequency fc, expressed in expression (3) below, flows through this serial circuit.

$$fc = (1/(L \cdot 2 \cdot C1) - (r/(2L))^2)^{0.5}/2\pi \text{ [Hz]} \quad (3)$$

The peak current ipeak may be expressed as;

$$ipeak = 2V/((4L \cdot r^2/(2 \cdot C1))^{0.5} \text{ [A]} \quad (4)$$

with V representing the capacitor initial voltage. In this situation, if the inverter input DC voltage vdc is 350 [V] (the initial voltage V at C1 is half this value at 175 [V]), the resistance r of the wiring for one phase extending from the inverter to the motor is 1 [mΩ], its inductance L is 0.5 [μH], the main capacitor C0=900 [μF] and the Y capacitor=1 [μF], the frequency of the resonance current will be 159[kHz] and the peak current will be 495 [A].

Figure 7B:
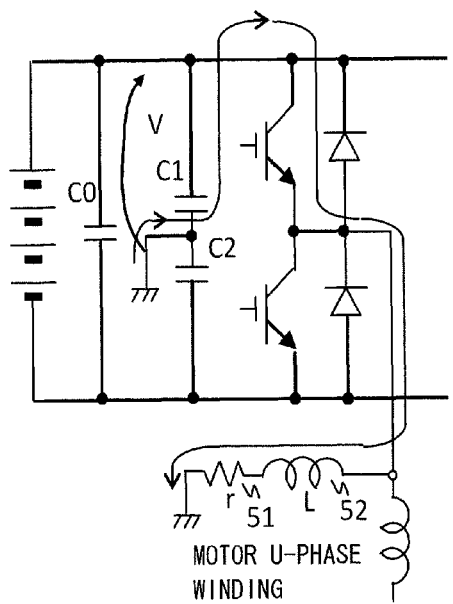
Figure 7C:
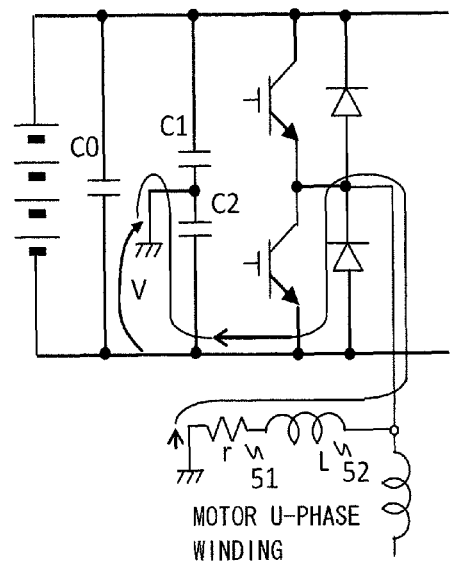

Since the frequency of such an electric current is more than 10 times higher than the frequency of sampling executed at the microcomputer control frequency (=current detection frequency) through a microprocessor (microcomputer)-based control method of the related art, it cannot be detected with ease via the microcomputer through the control method of the related art. Furthermore, this current is lower than the overcurrent sensing level (600 [A] in the embodiment) set in conjunction with a typical protection circuit for the gate drive circuit, and even if the transistors at the inverter are switched as the current flows, the current path shown in FIG. 7B is altered to the current path (see the arrows in the figure) in FIG. 7C. Thus, the transitory phenomenon occurs at the equivalent circuit in FIG. 7A at every switchover. As a result, the resonance current exceeding the continuous rating of, for instance, 300 [A], continuously flows.

The fault modes other than the ground fault mode include the power short-circuit mode, line-to-line short-circuit mode and the phase-to-phase short-circuit mode. As FIGS. 6B, 6C and 6D indicate, the path through which the short-circuit current flows and the operation executed in the power short-circuit mode, the line-to-line short-circuit mode and the phase-to-phase short-circuit mode are similar to one another. Since these modes are equivalent to the impedance between inverter output lines becoming lowered and the resonance frequencies corresponding to the individual fault modes can be calculated through similar operations, the line-to-line short-circuit mode is described in some detail below as a representative example.

Line-to-Line Short-Circuit

Figure 8B:
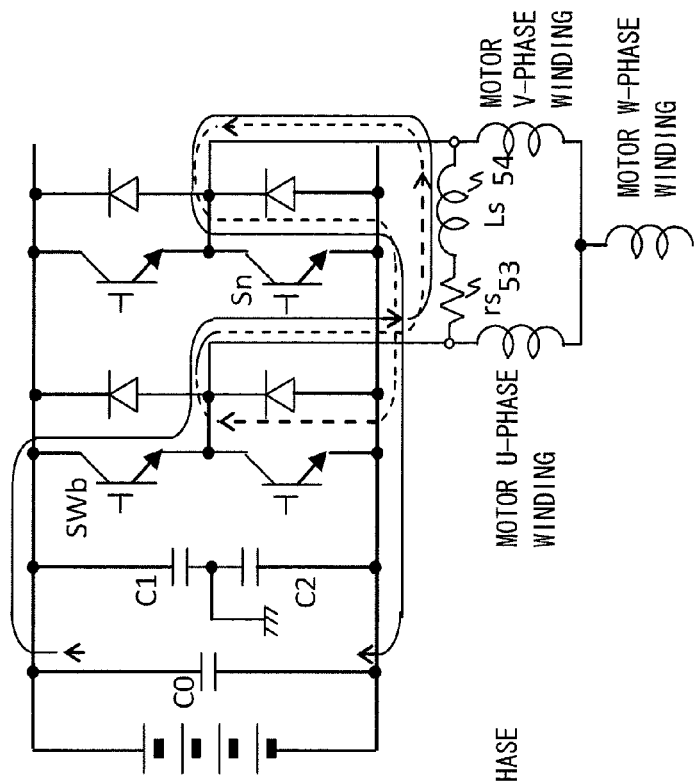
FIGS. 8A and 8B are circuit diagrams showing the current path through which the electric current will travel in the event of line-to-line short-circuit in the electrical drive control system.
Figure 8A:
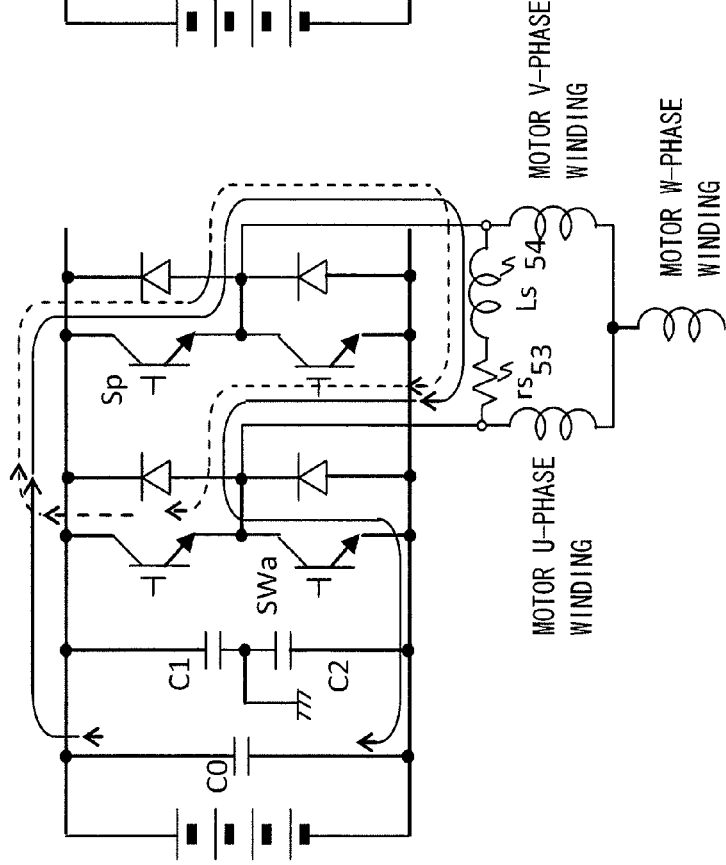

FIGS. 8A and 8B show how a current may flow in the line-to-line short-circuit mode shown in FIG. 6C. In the example presented in FIG. 8, line-to-line short-circuit occurs between the U-phase winding and the V-phase winding. It is to be noted that, for purposes of simplification, FIG. A only shows part of the inverter relevant to the particular line-to-line short-circuit event. Since the transistors related to the line-to-line short-circuit event may be anyone of the U-phase transistors, the V-phase transistors or the W-phase transistors, thus they are simply notated as SWa, SWb, Sp and Sn in the figure.

Assuming the capacitance of the main capacitor 12 as C0, the resistance 53 and the inductance of the wiring between the short-circuited points respectively as rs and Ls, the resonance frequency fcs can be calculated as $$fcs=(1/(Ls \cdot C0)-(rs/(2Ls))^2)^{0.5}/(2\pi) \text{ [Hz]} \quad (5)$$

For instance, a resonance frequency value of 2.4 [kHz] can be calculated, applying the inductance Ls of 5 [μH] and the same circuit constants as those described earlier. If the inverter PWM cycle is 10 [kHz], the transistor SWa in FIG. 8A, for instance, is switched four times during a single resonance cycle.

Figure 9:
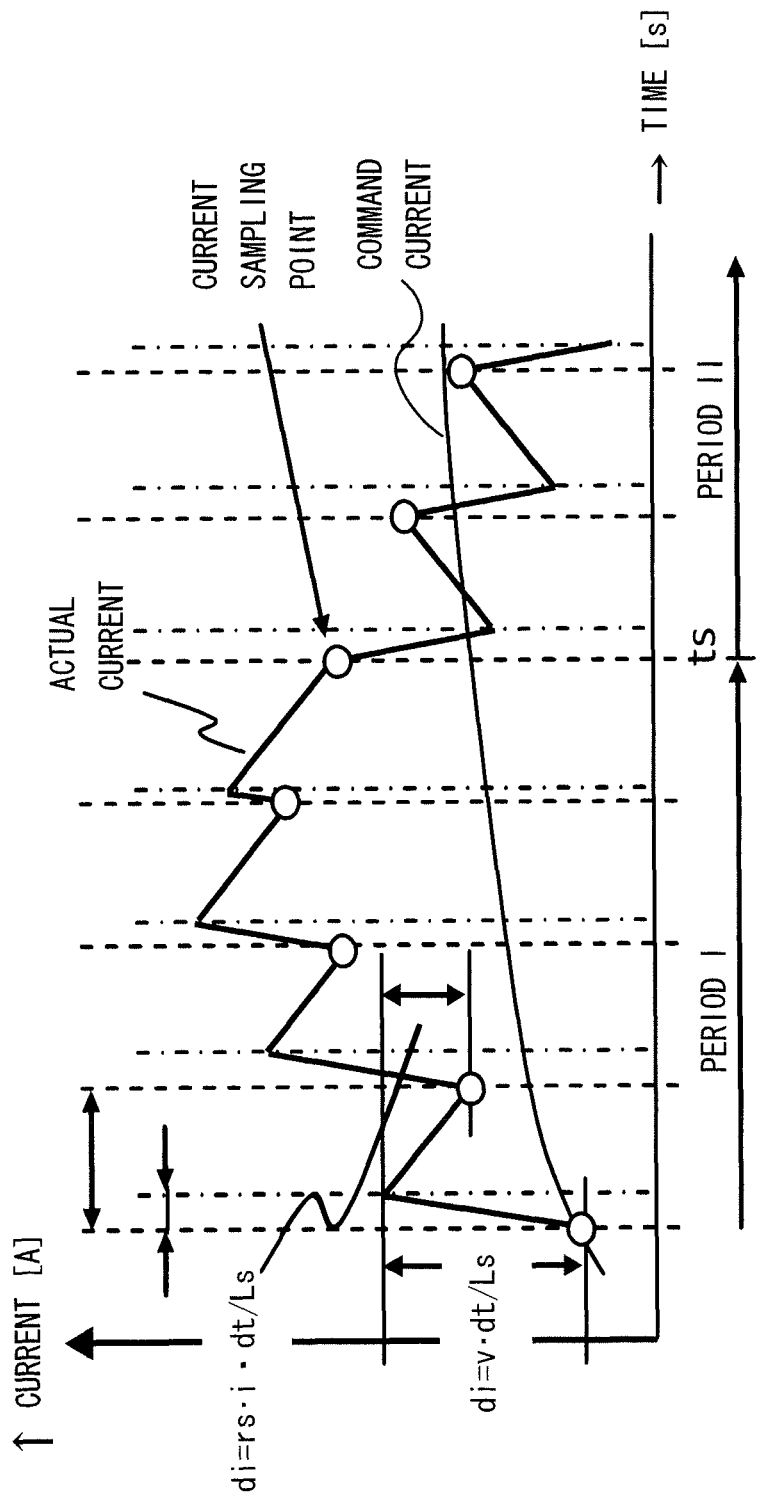
FIG. 9 schematically shows how the current control in the electrical drive control system may enter an oscillating state.

FIG. 9 schematically shows the current response that may be observed under the conditions described above immediately after the short-circuit event occurs. It is assumed that as the current response shown in the figure occurs while the transistor Sp is in the ON state. The reason that the actual current waveforms in a period I and a period II differ slightly each other, as shown in the figure, is as follows.

Period I: As the actual current overshoots by a significant extent relative to the command current, though the current control is executed, the current continues to rise in the current, with the ON duty of the transistor SWa shown in FIG. 8A being decreased. Since the inductance 54 Ls is smaller than the motor winding inductance, the rate of change in the electric current expressed as; $di=v \cdot dt/Ls$ (v is the voltage between shorted terminals) increases, which, in turn, induces an overshoot. It is to be noted that the solid line arrows in FIG. 8A indicate the path through which the current flows while the transistor SWa is on (a DC voltage is applied between the shorted lines), whereas the dotted line arrows in FIG. 8A indicate the path through which the electric current flows while the transistor SWa is off (zero voltage is applied between the shorted lines).

Time point ts: As the voltage command input to the coil (rs, Ls) is inverted to a negative value, the transistor SWb in FIG. 8B is selected for a switchover (on/off). The transistor Sn enters the ON state.

Period II: Since the inductance Ls at the coil is lower than normal, even if the duty of the transistor SWb shown in FIG. 8B is adjusted by current control, the actual current largely undershoots compared with the command current. It is to be noted that the solid line arrows in FIG. 8B indicate the path through which the current flows while the transistor SWb is on (a DC voltage is applied between the shorted lines), whereas the dotted line arrows in FIG. 8B indicate the path through which the electric current flows while the transistor SWb is off (zero voltage is applied between the shorted lines).

The saw tooth waveform of the actual current shown in FIG. 9 may be interpreted to indicate an oscillating control state, caused by a relatively high gain in the current control system according to impedance decrease. In addition, the detection range of the current detectors used in the control is set up on the premise that the current control remains functional, as explained earlier. This means that, in the event of a significant overshoot or undershoot, the detection values will be clamped, and that the control system will be further trapped into the oscillation. Compared to the frequency of the current flowing in the ground fault mode, the frequency of the current flowing in the line-to-line short-circuit mode is lower and thus, the current can be accurately sampled by the microcomputer within the detection range. Furthermore, any current that has been clamped can be recognized through this detection. However, there may still be situations in which an overcurrent cannot be detected based upon the overcurrent fault detection algorithm normally used in the microcomputer.

Overcurrent Fault Detection Method in the Related Art

The following is a description of the overcurrent fault detection method in the related art, followed by descriptions of the overcurrent fault detection device according to the present invention, which is improved over the prior art, and of the detection method adopted in conjunction with the overcurrent fault detection device according to the present invention. In order to eliminate any risk of erroneous detection, a time window is set in an overcurrent fault detection algorithm normally adopted in conjunction with a microcomputer. In more specific terms, if an overcurrent is detected consecutively over a predetermined number of sampling cycles, it is confirmed that an error has occurred in such an overcurrent fault detection algorithm (see the flowchart presented in FIG. 5).

Figure 10:
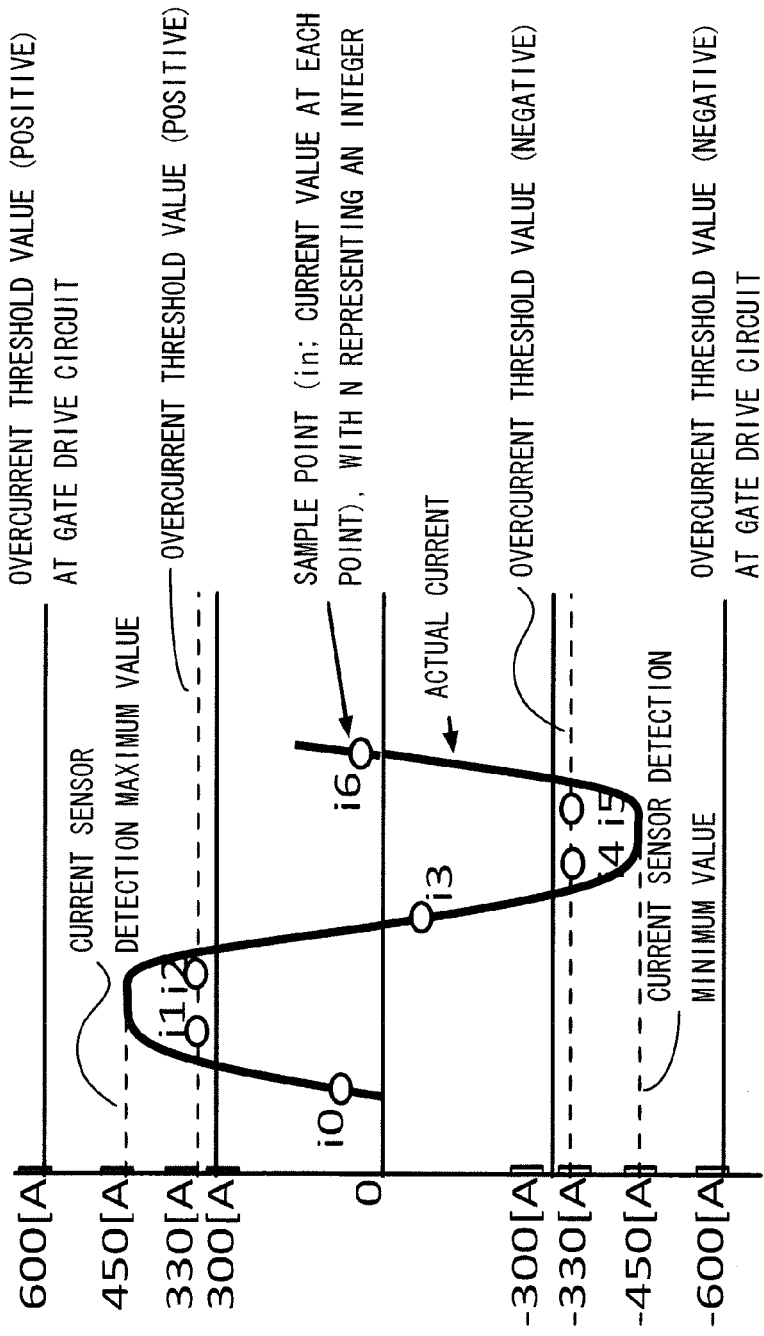
FIG. 10 presents an example of a current waveform in an oscillating state as sampled by the microcomputer.

However, an overcurrent may not be accurately recognized with the regular overcurrent fault detection algorithm adopted in conjunction with a microcomputer, as demonstrated in FIG. 10. In the example of FIG. 10, it is assumed that current control and overcurrent fault detection are carried out at 10 [kHz] in the system. This system is designed so as to determine that an overcurrent has occurred if an electric current with an oscillation frequency of 2.5 [kHz] and an amplitude of 450 [A] flows due to a line-to-line short-circuit fault and the current value exceeds the threshold value over three consecutive sampling cycles set as the time window. FIG. 10 shows that a positive-side overcurrent is detected twice consecutively and a negative-side overcurrent is also detected twice consecutively. However, since the overcurrent fault detection criterion of an overcurrent, i.e. detection of overcurrent three consecutive times, is not satisfied, it is not determined as an overcurrent has occurred. It is to be noted that overcurrent fault detection points i1 and i2 on the positive side and overcurrent fault detection points i4 and i5 on the negative side in FIG. 10 each indicate a point at which a clamped current value is detected.

If the system fails to recognize an overcurrent, as described above, it will allow the oscillating current to flow continuously, which may lead to a fatal condition that will destroy the elements. In addition, in the top fault mode, too, the impedance at the inverter output end will become very low and thus, the current control oscillation may be induced.

Accordingly, the overcurrent fault detection device in the embodiment adopts an algorithm that allows an overcurrent to be accurately recognized by detecting the frequency or the cycle of the high-frequency current with a large amplitude induced in any of the three fault modes described earlier. Namely, in addition to the algorithm for recognizing an overcurrent when the current amplitude exceeds a predetermined threshold value, a frequency/cycle detection algorithm is also built into the overcurrent fault detection device in the embodiment.

The following is a description of the overcurrent fault detection device and the overcurrent fault detection method according to the present invention.

Embodiment 1

As has already been described in reference to FIG. 3, the outputs of the individual phase current detectors are input to the A/D converter 19 in the microcomputer 39 and are also input to the comparator with hysteresis 20. In order to convert the current oscillating with large amplitude into pulses, the hysteresis width may be set, for example, to approximately 100 [A] for the comparator with hysteresis 20, when transistors with a continuous rating of 300 [A] are used. The output of the comparator 20 is connected to terminals at the external pulse counters 21, 22 and 23 in the microcomputer 39. Initial settings are done through separate processing (not shown) for the pulse counters 21, 22 and 23 so that a count increment occurs at the leading edge of a pulse.

In addition, for controlling the electric current and the torque at the motor 3, the output of the DC voltage detector 4 is input to the A/D converter 19, and the R/D converter 24 that converts the signal from the rotational position detector (resolver) 8 into an angle is connected to the external bus 25 of the microcomputer 39. At each PWM timer (26, 27 or 28) in the microcomputer 39, the ON time, i.e., the length of time over which the transistors in the corresponding phase constituting the inverter 2 switched to ON state, is set, and the microcomputer 39 outputs a PWM signal to the gate drive circuit 10. The ON time of the transistors corresponding to each phase is determined through an arithmetic operation executed by the CPU 31. A common carrier (fc) timer 29 is connected to the PWM timers 26, 27 and 28 corresponding to the individual phases and thus, a PWM carrier cycle in each phase is generated with the carrier timer. Then, a narrow pulse (e.g., a pulse "1" with a width 1 [μs]) is output over each carrier cycle, and the conversion via the A/D converter 19 is started and the various phase currents (iu, iv, iw) and the DC voltage vdc, which are sampled by sequentially switching their inputs via the multiplexer & sample hold 32 (sampling circuit), are stored into the corresponding resistors as initial settings in a separate processing (not shown in the figure).

Overcurrent Fault Detection Processing

Figure 11:
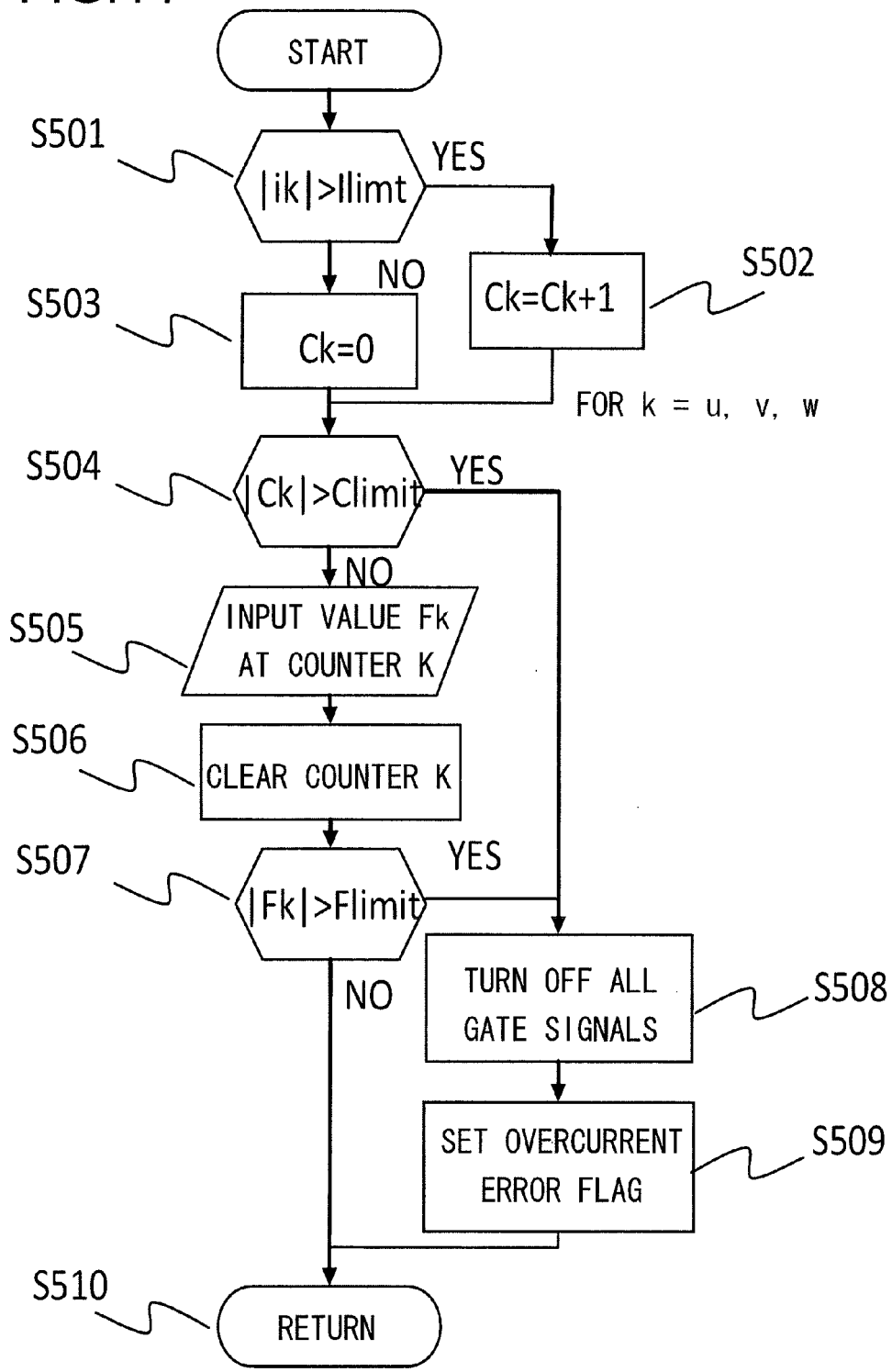
FIG. 11 presents a flowchart of the overcurrent fault detection processing according to the present invention executed by the control circuit shown in FIG. 3.

FIG. 11 presents a flowchart of the overcurrent fault detection processing according to the present invention. The processing in this flowchart is executed over predetermined cycles. The overcurrent fault detection processing is called up in step S805 in FIG. 4 each time the current control processing is executed in the embodiment. First, through the processing executed in step S501 through step S504 in the flowchart presented in FIG. 11, a decision as to whether or not an overcurrent has occurred is made by comparing the amplitudes of the currents with the threshold value. Then, in step S505, a counter value Fk is read from each external pulse counter to which the comparator with hysteresis is connected. Upon completing the read, the counter is cleared in step S506.

Assuming that the processing is executed every 100 [μs] (i.e. every time the current control processing is executed over 100 [μs] cycles), an Fk value of 1 will be equivalent to 1/100 [μs]=10 [kHz]. Namely, the pulse frequency FPk [Hz] can be converted to a frequency as expressed;

$$FPk = Fk/Tsampl \quad (6)$$

with Tsampl [s] representing the processing execution cycle. In addition, a counter threshold value Flimit in reference to which overcurrent decision-making is executed may be set as;

$$Flimit = FPlimit \cdot Tsampl \quad (7)$$

with FPlimit [Hz] representing the frequency threshold value.

In step S507, the counter value Fk is compared with the threshold value Flimit of the counter for determining that an overcurrent has occurred. If the counter value exceeds the threshold value, all the transistor elements in the inverter are turned off in step S508, an overcurrent error flag is set in step S509 and then the operation returns to the current control processing in step S510. Once the overcurrent error flag is set, the processing in the flowchart presented in FIG. 4 is suspended until the overcurrent error flag is cleared upon deciding that the processing can be restarted by following a predetermined procedure through separate processing (not shown).

It is to be noted that in the event of a fault occurring in a fault mode such as the line-to-line short-circuit mode, the frequency of the oscillating overcurrent may be lower than the current control cycle and, in such a case, the processing in step S505 through step S509 may be executed over a cycle different from the current control cycle, e.g., the processing may be executed every 10 [ms].

Assuming the capacitance of the Y capacitor in an inverter typically utilized in automotive applications to be equal to or less than 2 [μF], and the length of the wiring extending from the inverter to the motor to be equal to or less that 10 [m], whereby the resistance and the inductance at the wiring are respectively 1 [mΩ] or less and 1 [μH] or less and that a ground fault has occurred at a wiring end, the resonance frequency is calculated to be 113 [Hz] through expression (3). 113 [Hz] thus calculated can be set as FPlimit.

In addition, when a line-to-line short-circuit detection or a phase-to-phase short-circuit detection is carried out, the settings for these detections are done in reference to the current control cycle (current detection cycle) of the microcomputer. For instance, when the currents are detected every 100 [μs], assuming that the microcomputer will not be able to complete the overcurrent decision-making based upon the detected currents within a length of time 10 times the length of the current detection cycle, 1 [kHz] may be set for FPlimit. This FPlimit value is lower than the frequency measured in the event of a ground fault, overcurrent faults including the ground fault can be detected.

It is to be noted that the frequency of an overcurrent occurring in the ground fault mode, the line-to-line short-circuit mode or the phase-to-phase short-circuit mode can be calculated as expressed in (3) or (5). However, since a relationship expressed as; $1/(L \cdot 2 \cdot C1) \gg (r/2L)^2$ or $1/(Ls \cdot C0) \gg (rs/(2Ls))^2$ is satisfied in the corresponding expression in these fault modes, the expressions can be simplified to;

$$fc=(1/(L \cdot 2 \cdot C1))^{0.5}/(2\pi) \text{ [Hz]} \qquad (8) \text{ or}$$

$$fcs=(1/(Ls \cdot C0))^{0.5}/(2\pi) \text{ [Hz]} \qquad (9)$$

The frequency can thus be calculated as expressed in (8) or (9).

However, in a motor drive system that drives a motor with eight pairs of poles at a maximum rotation rate of 10,000 [rpm], the frequency of a fundamental current output from the inverter will be as high as 1.333 [kHz] (=(10,000/60)×8), which may lead to a trouble of erroneous overcurrent detection, even though this is a normal operation condition, when a comparator having a hysteresis width centered at 0 is used.

In order to prevent such trouble, a comparator assuming a hysteresis width centered on the inverter fundamental current may be employed. For instance, a type 2 (see FIG. 16B) comparator with hysteresis equipped with a hysteresis central value altering circuit may be utilized. A specific method of detection executed in conjunction with such a comparator will be described later in reference to embodiment 3. As an alternative, a type 3 (see FIG. 16C) comparator with hysteresis equipped with a subtractor circuit may be utilized.

Embodiment 2

Figure 12:
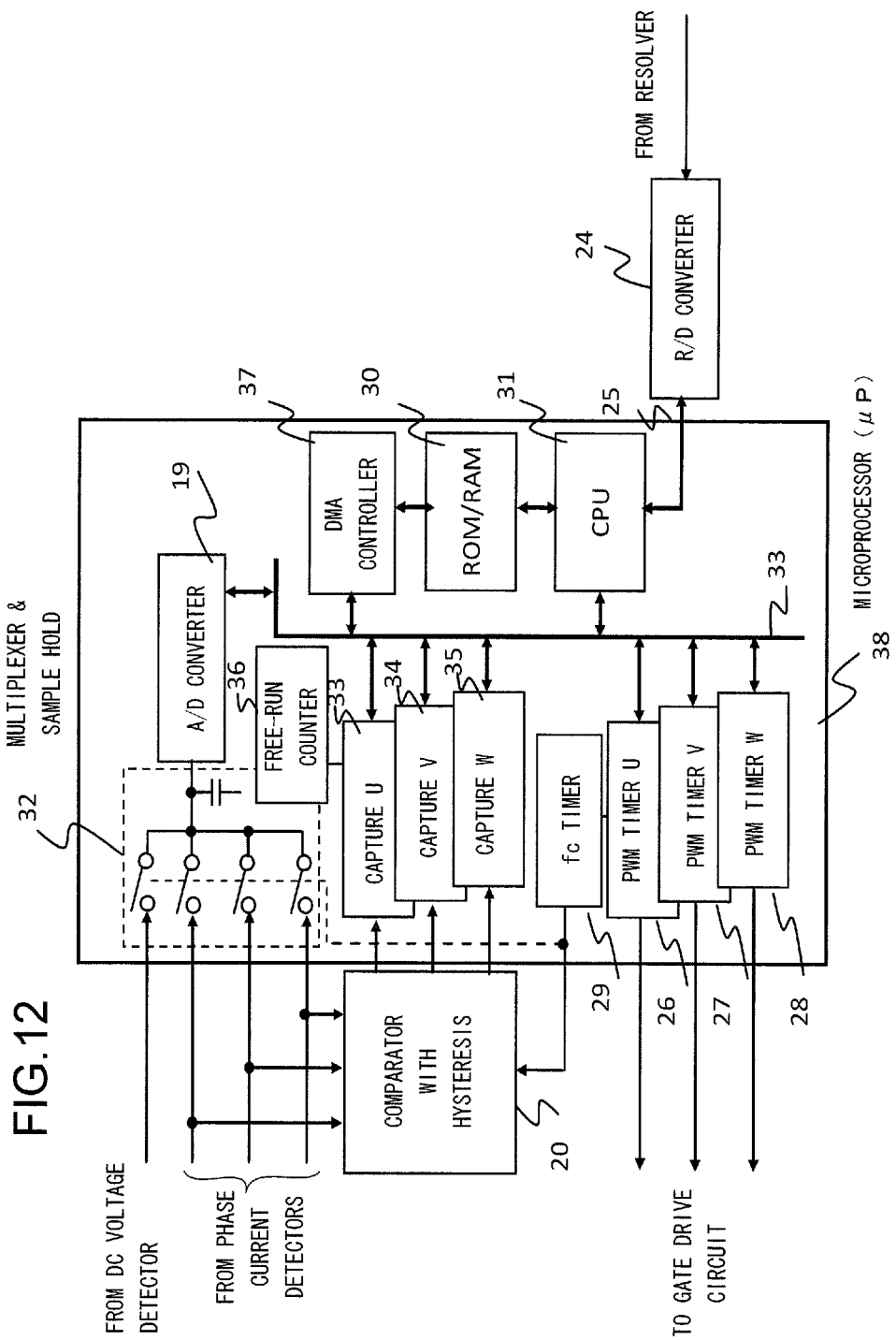
FIG. 12 is a block diagram presenting another example of a structure that may be adopted in the control circuit built into an electrical drive control system embodying the present invention.

FIG. 12 is a block diagram of the control circuit achieved in another embodiment of the present invention. This control circuit is characterized in that; replacing the counters 21, 22 and 23 in the microcomputer with (1) the comparator outputs corresponding to the various phases are each connected to a terminal of one of three captures 34, 35 and 36, (2) an additional free-run counter 37 installed for purposes of time count, and (3) a DMA controller 38 is added in order to transfer data output from the individual captures to predetermined RAM areas.

Figure 13A:
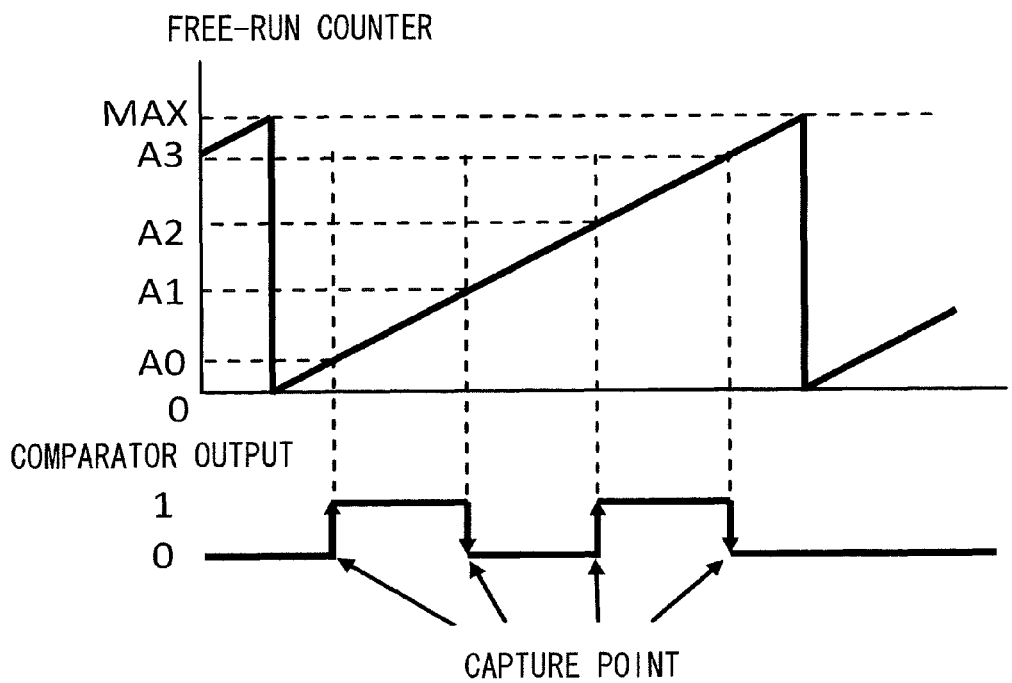
FIGS. 13A and 13B respectively show the capture operation executed by the control circuit shown in FIG. 12 and the capture data stored into the RAM through a DMA transfer.

As shown in FIG. 13A, each capture reads the values indicated at the free-run counter 37 at the rising edge and the falling edge (two edges) of a pulse input to a terminal thereof and transfers the values thus read to a specifide register. In response to the two edges of the pulse, the DMA controller 38 sequentially transfers the register values to a predetermined RAM address. Each time the DMA controller 38 transfers data, it increments the address by n [bytes]. Once it reaches a specifide stop address, the address is initialized to the start address and the DMA controller continuously increments the address each time it transfers data.

Figure 13B:
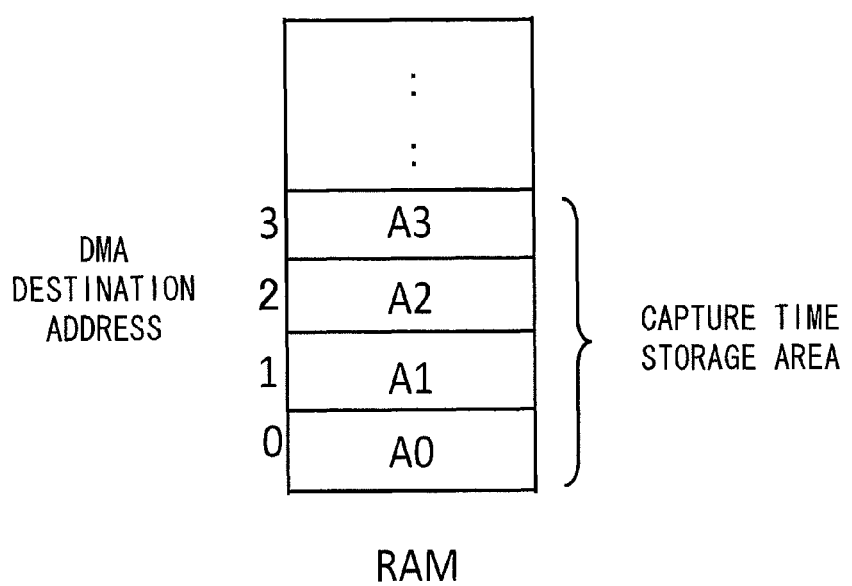

In the example presented in FIG. 13B, each register holds four bytes of data and the DMA controller is set so that each time a total of four sets of data (16 [bytes]) is transferred to the RAM, the DMA destination address is initialized to the start address (from address "3" to address "0" in the figure).

FIG. 14 presents a flowchart of the overcurrent fault detection processing executed in the embodiment. This processing is executed with a predetermined cycle, e.g., 10 [ms], which is different from the current control cycle. After the processing start, the current detection values are captured and the count values at the free-run counter 37, stored in a predetermined area in the RAM, are read in step S601. At this time, two sets of data (Ak(n), Ak(n+1)) are read from two adjacent addresses. More specifically, data are read cyclically two sets at a time, e.g., data from address 0 and address 1, data from address 1 and address 2, data from address 2 and address 3, data from address 3 and address 0, data from address 0 and address 1, and so forth.

In step S602, the difference (pulse cycle) between the two sets of data is calculated. While the flowchart does not include details, the data from the end point address are subtracted from the data from the start point address if the two sets of data have been read from the start point address and the end point address, but otherwise the data of the address with the smaller address number are subtracted from the data of the address with the larger address number in this step. In other words, the data having been captured earlier are subtracted from the data captured later. Through this operation, the positions of rising edge/falling edge of the pulse are detected, and the frequency of the pulse can then be determined based upon the positions of rising edge/falling edge of the pulse.

In step S603, the pulse cycle having been measured is compared with the threshold value so as to determine whether or not an overcurrent has occurred. If the cycle is less than a predetermined level, it is determined that an overcurrent has occurred. In this case, all the transistor elements in the inverter 2 are turned off in step S604, an overcurrent error flag is set in step S605, and then the operation returns to the current control processing in step S606. If the cycle is equal to or greater than the predetermined value, the operation proceeds to step S606 to return to the current control processing. It is to be noted that settings should be selected so as to call up the overcurrent fault detection processing, executed as shown in the flowchart presented in FIG. 5 by detecting the amplitudes through the method in the related art, in step S805 in the current control processing flowchart presented in FIG. 4.

The devices achieved in embodiments 1 and 2 each achieve a unique advantage in that since a decision as to whether or not an overcurrent has occurred is made based upon the frequency or the cycle, an overcurrent can be detected even when the peak of the high-frequency current is beyond the detection range of the current detectors connected to the control microcomputer or when true current values cannot be read due to clamping.

The cycle length threshold value, in reference to which such a decision is made, may be set to the reciprocal of the frequency threshold value by which the decision is made in the method described in reference to embodiment 1.

Figure 15:
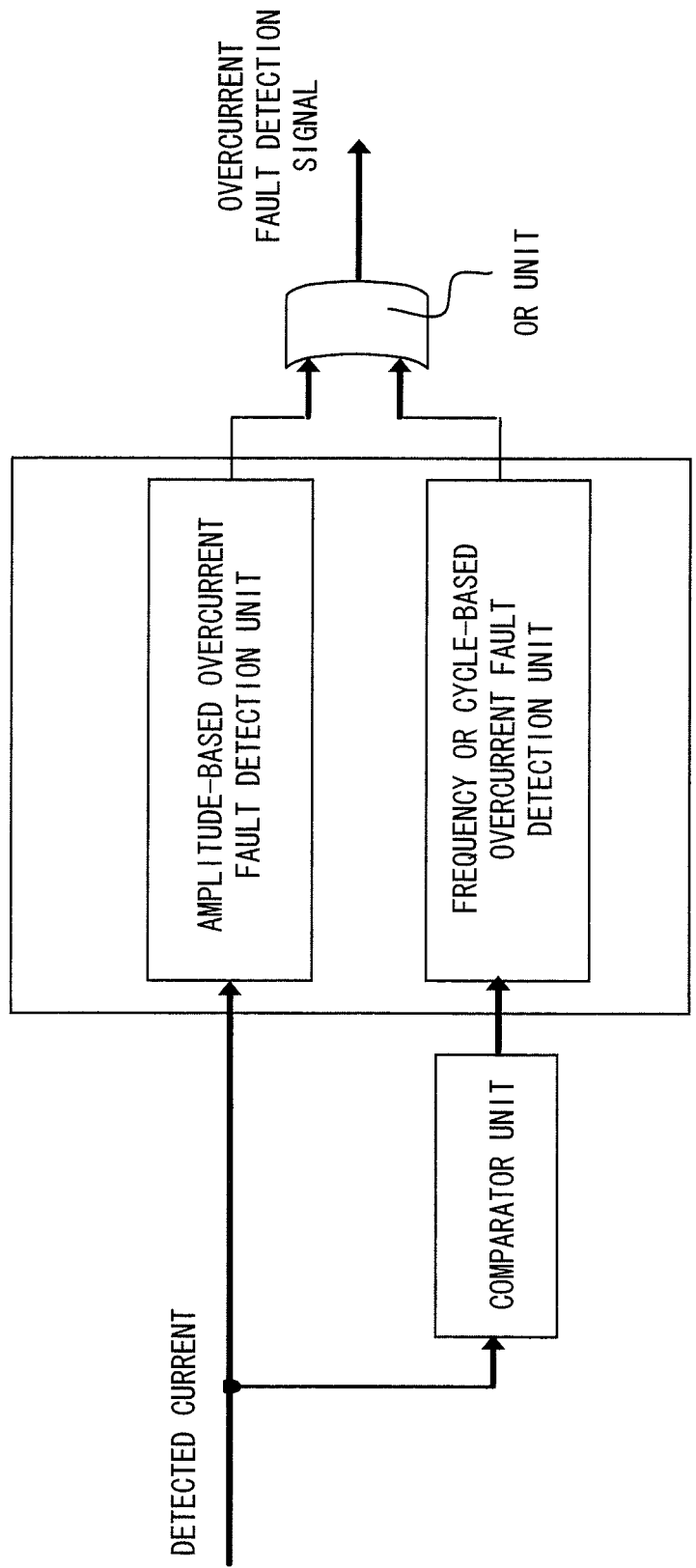
FIG. 15 schematically illustrates the overcurrent fault detection device and the overcurrent fault detection method according to the present invention in a functional block diagram.

FIG. 15 shows the functional blocks corresponding to one phase, which are involved in the overcurrent fault detection processing executed in embodiment 1 or embodiment 2. Both the embodiment 1 and embodiment 2 are provided with an overcurrent fault detection unit that detects an overcurrent based upon the current frequency or the current cycle, in addition to an overcurrent fault detection unit that detects an overcurrent based upon the current amplitude. In either embodiment, the control circuit generates an overcurrent fault detection signal based upon the OR of the outputs from the two detection units, and thus, an abnormal current caused by a ground fault, phase-to-phase short-circuit or line-to-line short-circuit, which cannot be detected easily in the related art, can be detected.

Embodiment 3

Figure 16A:
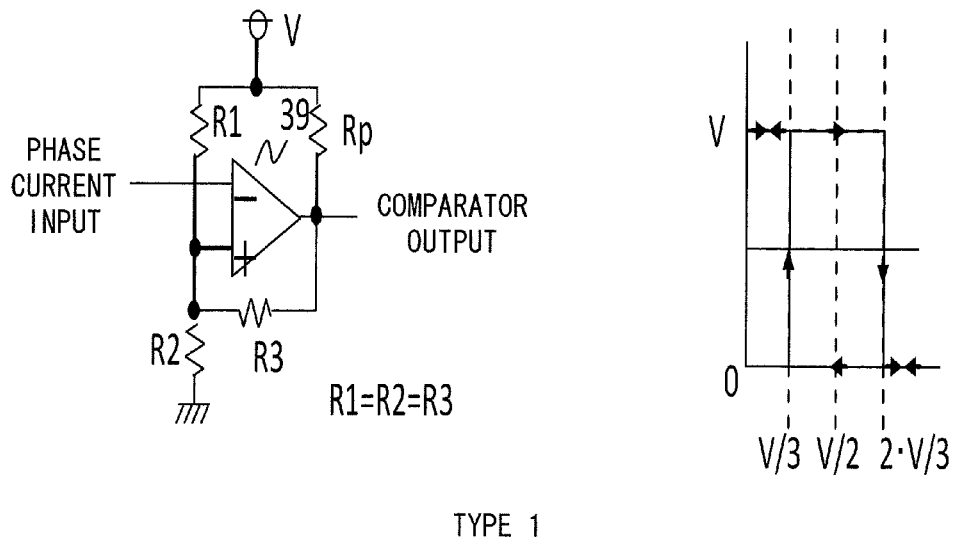
FIGS. 16A through 16C show circuit structures that may be adopted in various comparators with hysteresis.
Figure 16B:
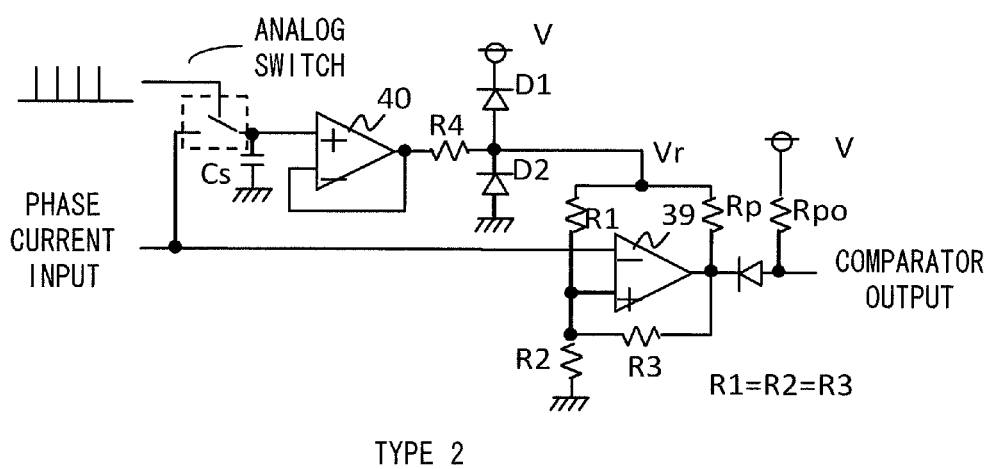
Figure 16C:
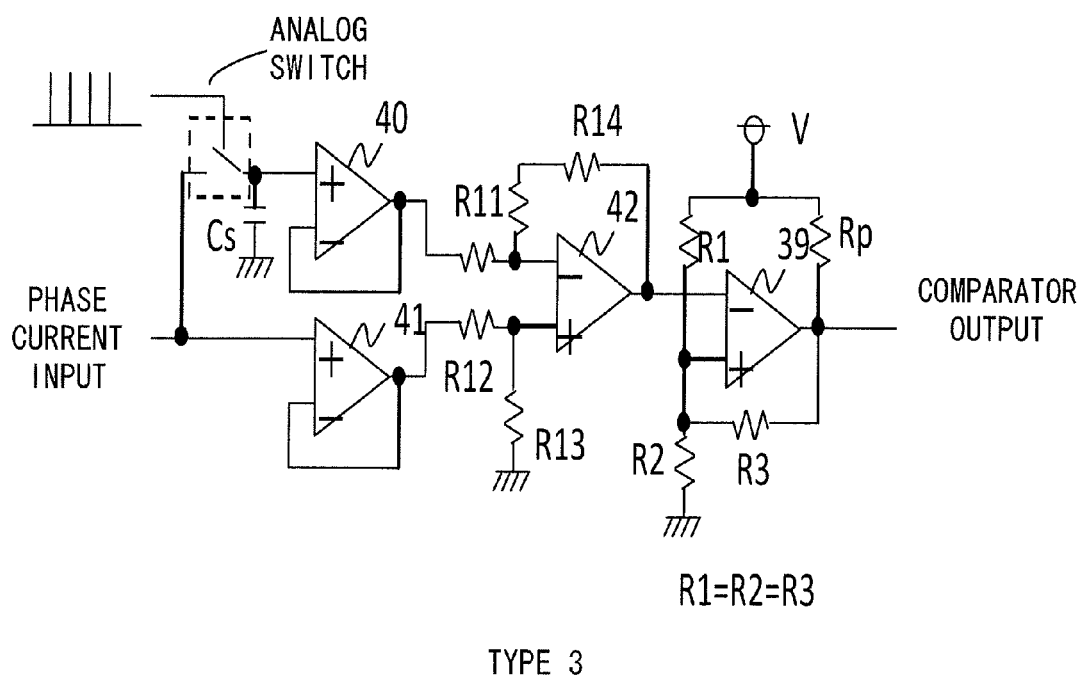

FIGS. 16A through 16C each present an example of a structure of comparator with hysteresis used in the present invention for one phase. Each comparator with hysteresis operates in conjunction with a current detector having an output range of 0 to 5 [V], which outputs 2.5 [V] when the current value is 0 [A]. For purposes of convenience, the following description is provided by assuming that the voltage is output linearly relative to the current, with 5 [V] output at 300 [A] and 0 [V] output at −300 [A].

The type 1 comparator with hysteresis shown in FIG. 16A is an open collector output-type comparator that can be driven on a single 5 [V] power source and comprises R1 to R3 used to form a hysteretic voltage (width) and a pull-up resistor Rp used on the comparator output side. Assuming that R1=R2=R3 and Rp is sufficiently smaller than R1, and that V is 5 [V], the hysteresis width of the comparator becomes ±0.84 [V] centered on 2.5 [V]. The threshold based upon the characteristics of the current detector described above is ±100 [A] (=0.84×300/2.5) and thus, the comparator outputs will indicate "0" when the current exceeds 100 [A] and the comparator output will switch to "1" when the current becomes lower than −100 [A].

For instance, in the event of a ground fault or line-to-line short-circuit as described earlier, a oscillating current exceeding 400 [A] flows. Thus, the comparator output is provided as a 159 [kHz] pulse train in the event of a ground fault, whereas the comparator output is provided as a 2.5 [kHz] pulse train in the event of line-to-line short-circuit. The decision as to whether or not an overcurrent has occurred can be made through the microcomputer processing described in reference to embodiment 1 or embodiment 2. In addition, the cause of an overcurrent can be identified as a ground fault or as line-to-line short-circuit based upon the pulse frequency, as described later. Namely, a specific fault mode among the fault modes described earlier can be identified.

Unlike the type 1 comparator with hysteresis provided with the comparison reference voltage V (fixed), the type 2 comparator with hysteresis in FIG. 16B uses a detected phase current value held with predetermined timing. It is to be noted that a diode D and a resistor Rpo (Rpo<<Rp) added at the comparator output are used to convert the output voltage to 0-5 [V]. The comparator with hysteresis adopting this system assumes a hysteresis width centered on the actual current detected at the particular sampling point.

Figure 17:
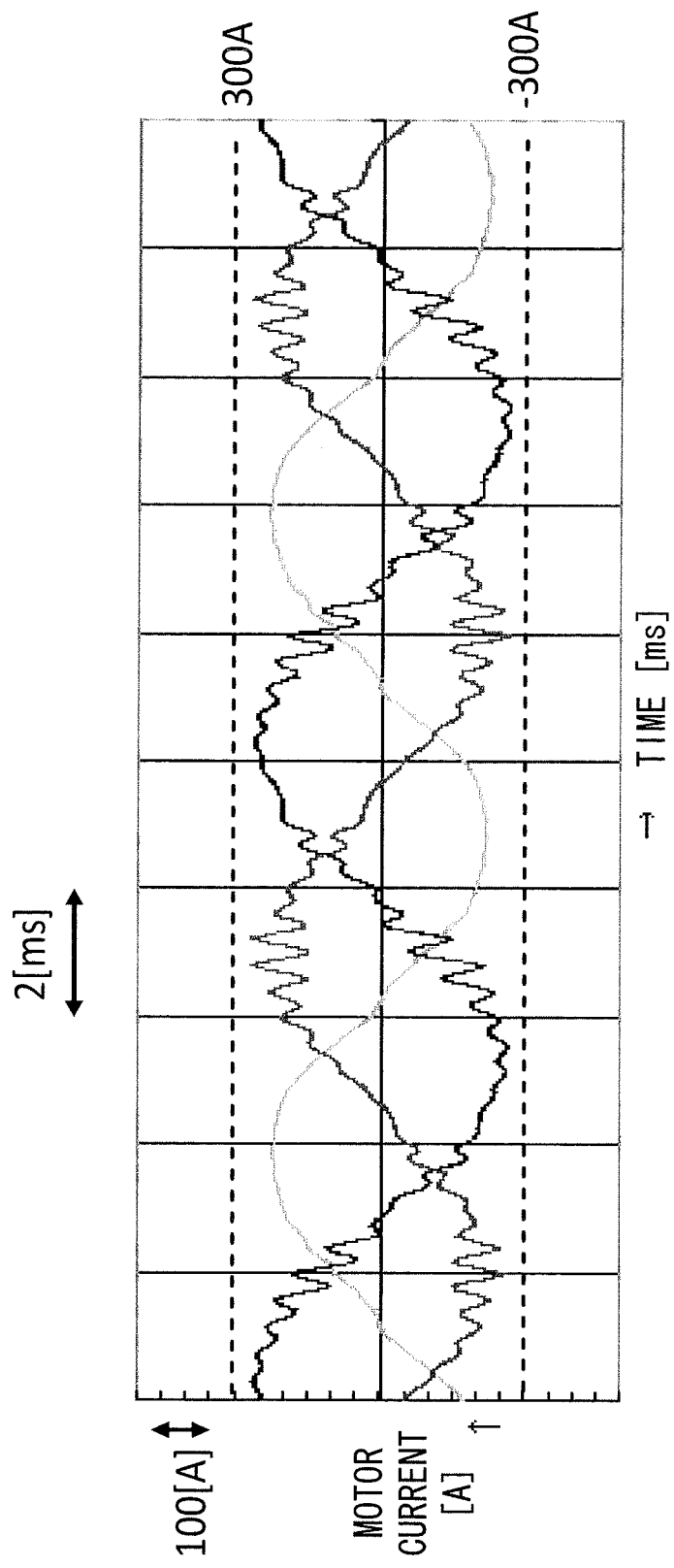
FIG. 17 presents an example of a current waveform of a current entering an oscillating state in the event of phase-to-phase short-circuit.

FIG. 17 presents an example of a waveform with a beat-like oscillating current superposed on a sine-wave-like low-frequency current (corresponds to the command current). This kind of waveform may be generated in the event of line-to-line short-circuit or phase-to-phase short-circuit shown in FIG. 6C or FIG. 6D. For this kind of waveform, or for the case that the fundamental wave frequency is close to the frequency induced by oscillation, the type 2 comparator with hysteresis shown in FIG. 16B is particularly effective.

As shown in FIG. 16B, holding of the current value can be performed by a sample hold circuit constituted with a buffer operational amplifier 40, a capacitor Cs and an analog switch. As the analog switch closes at the hold timing, and the capacitor is charged with the voltage of the hold timing. Subsequently, the analog switch opens, and the voltage immediately before the switch is opened (i.e., the detected current value) is held.

It is to be noted that the hysteresis central value can be adjusted by providing an output Vr of a hysteresis central value altering circuit, constituted with the sample hold circuit described above, a resistor R4 and diodes D1 and D2 to the comparator instead of the voltage V provided to the type 1 comparator with hysteresis.

The type 3 comparator with hysteresis shown in FIG. 16C, although assuming a more complicated circuit structure than the type 2 comparator is, nevertheless, similar to the type 2 comparator with hysteresis in that it compares the detection value to a reference value centered on the actual current held with predetermined timing. While the comparator with hysteresis itself in this circuit structure is identical to the type 1 comparator, the circuit includes a differential amplifier constituted with operational amplifiers 40, 41 and 42 and resistors R11 through R14, which is engaged in comparator preprocessing through which the actual current held with the predetermined timing is subtracted from the detected current. Thus, it achieves a unique advantage in that the hysteresis width does not change, which the type 2 comparator with hysteresis does not provide, while proving to be particularly effective, as is the type 2 comparator with hysteresis when a beat-like oscillating current centered on a low-frequency current (command current) appears or when the fundamental frequency is close to the frequency induced by oscillation.

The predetermined timing with which the current value is held at the type 2 comparator with hysteresis and the type 3 comparator with hysteresis may be, for instance, set in correspondence to the PWM carrier cycle. Such timing may be set by the microcomputer 39, as indicated in the block diagram provided in FIG. 3 or FIG. 12.

As a variation to the type 2 comparator with hysteresis or the type 3 comparator with hysteresis, a voltage value corresponding to the command current value, in place of the actual current value held at a predetermined timing, may be output from the microcomputer 39 via, for instance, a D/A converter, and the voltage value thus output may be used as the comparison reference voltage at the comparator. As a further alternative, the results obtained by subtracting the voltage value corresponding to the command current value from a voltage value that corresponds to the actual current value may be provided to a comparator with a fixed hysteresis width.

Figure 18:
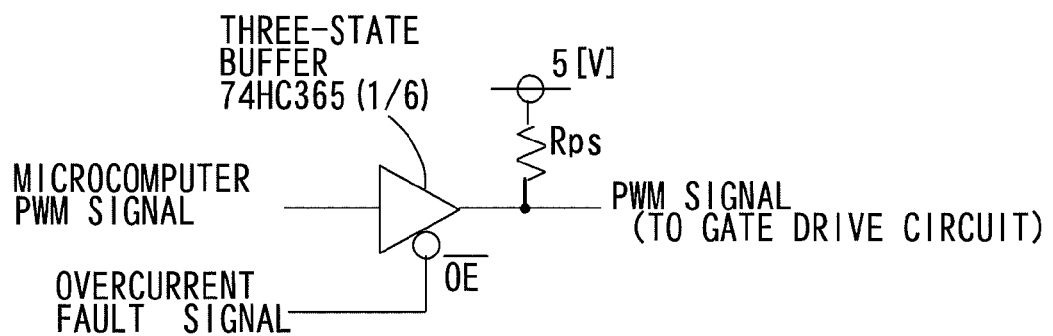
FIG. 18 presents an example of a circuit that may be built into the gate drive circuit in order to achieve overcurrent protection by hardware.

While all the transistors in the inverter are turned off through the microcomputer processing in the embodiments described above, a circuit such as that shown in FIG. 18 may be built into the gate drive circuit so as to turn off all the transistors in response to decision results by the microcomputer 39. The circuit shown in FIG. 18 corresponds to one phase of PWM signals. The overcurrent fault signal is designed so as to indicate "1" upon detecting an abnormal current but indicate "0" otherwise. All the transistors in the inverter can be turned off by designing the gate drive circuit so as to turn off the transistors in response to the overcurrent fault signal indicating "1".

While the transistors in the inverter are all turned off as a protective measure upon determining that a fault has occurred, all the upper arm transistors or all the lower arm transistors in the inverter may be turned on as an alternative. In such a case, an open state is assumed between the DC power source (battery) and the load and thus, all the load terminals become shorted.

In addition, the cause of an overcurrent fault can be determined and the corresponding fault mode can be identified by adopting the algorithm in the flowchart presented in FIG. 19. The processing executed as shown in the flowchart presented in FIG. 19 is described below. In step S191, the frequency having been stored into a specifide RAM address through the processing shown in FIG. 11 is input. The value input in this step is obtained by converting the counter FK value to a frequency. Next, in step S192, a decision is made as to whether or not the frequency having been input is equal to or greater than 100 kHz, and if an affirmative decision is made, the fault mode is determined to be the ground fault mode in step S194, and the operation returns in step S195. If, on the other hand, a negative decision is made, the fault mode is judged to be either the phase-to-phase short-circuit mode or the line-to-line short-circuit mode in step S193, and returns in step S195. By storing the fault mode thus identified into a nonvolatile memory or the like, these data can be read out later and utilized for determination of failure location.

While the overcurrent fault detection algorithm described enables detection of an overcurrent based upon the frequency, a similar algorithm may be adopted in the cycle length based overcurrent decision-making shown in FIG. 14. In such a case, additional processing must be executed to convert the cycle (Pk) to a frequency value when reading data in step S191.

While the two overcurrent fault detection algorithms, i.e., the current amplitude value based overcurrent fault detection algorithm and the current frequency/cycle based overcurrent fault detection algorithm, are built into the control system in the examples described above, the present invention may also be adopted in an overcurrent fault detection device equipped with only the current frequency based overcurrent fault detection algorithm or with only the current cycle based overcurrent fault detection algorithm.

By adopting the overcurrent fault detection device and the overcurrent fault detection method according to the present invention described above, an error caused by an output ground fault/power short-circuit, output line-to-line short-circuit or output phase-to-phase short-circuit in an electrical drive control system, which cannot easily be detected through sampling via a microcomputer typically engaged in the inverter control of the related art, can be detected with a higher level of reliability and with greater ease.

The various embodiments described above may be used either singly or in combination. This is because the beneficial effects of each of the embodiments may be obtained either singly or in synergy. Moreover, provided that the essential characteristics of the present invention are not lost, the present invention is not to be considered as being limited by any of the embodiments described above.

It is to be noted that while overcurrent detection executed in an electrical drive control system is described above, the present invention may be also adopted in detection of a oscillating current, which may not necessarily be an overcurrent, occurring in an electrical drive control system. In addition, while an explanation has been given above in reference to examples in which the present invention is adopted in the inverter in a hybrid drive vehicle or an electric vehicle, the present invention may be adopted in applications other than applications pertaining to these particular types of vehicles. In other words, the present invention may be adopted in various types of equipment and vehicles including railway vehicles, industrial vehicles and construction machines. Furthermore, the present invention may be adopted in all types of inverters used in industrial applications and home appliance applications.

What is claimed is:

1. An overcurrent fault detection device, comprising:
    an inverter that converts a DC current to three-phase AC currents in order to drive a motor;
    a DC voltage detector that detects a DC voltage value of a DC voltage flowing to the inverter;
    phase current detectors that detect respective phase current values of the three-phase AC currents;
    a rotational position detector that detects a rotational angle of the motor;
    a control circuit that controls a gate drive circuit, which controls output currents of the inverter at every predetermined cycle, based upon the phase current values provided by the phase current detectors, a motor rotational angle detection value provided by the rotational position detector and a speed command or a torque command issued by a higher-order control device;
    a decision-making circuit that detects an overcurrent based upon the phase current values detected by the phase current detectors at every predetermined cycle, wherein:
    the decision-making circuit includes a comparator with hysteresis provided with a predetermined hysteresis width, which carries out the frequency detection for any of the phase current values, and
    the decision-making circuit determines whether or not the phase current values exceed a predetermined amplitude threshold value by carrying out frequency detection for any of the phase current values exceeding the predetermined amplitude threshold value, and determines that an overcurrent has occurred upon detecting the frequency, and
    counters that count numbers of times of exceeding a predetermined amplitude for the phase current values respectively, by counting changes in output from the comparator with hysteresis, wherein:
    the decision-making circuit determines that an overcurrent has occurred upon detecting that any of the phase current values takes on a frequency of which amplitude exceeds a predetermined amplitude, based upon a count value having been counted on the counters.

2. An overcurrent fault detection device according to claim 1, wherein:
    the decision-making circuit detects an overcurrent in the every predetermined cycle, and
    the decision-making circuit determines that an overcurrent has occurred if any of the phase current values detected by the phase current detectors exceeds a predetermined amplitude threshold value.

3. An overcurrent fault detection device according to claim 1, wherein:
    the decision-making circuit further includes a subtractor circuit that subtracts a predetermined current value from any of the phase current values and inputs subtraction results; and
    an output from the subtractor circuit is input to the comparator with hysteresis.

4. An overcurrent fault detection device according to claim 1, further comprising:
    a capture that detects a rising edge position and a falling edge position of a pulse output from the comparator with hysteresis; and
    a free-run counter, wherein:
    the decision-making circuit detects that a cycle length of any of the phase current values exceeding a predetermined amplitude based upon the rising edge position and the falling edge position of the pulse, and detects a frequency of any of the phase current values exceeding the predetermined amplitude based upon the cycle length.

5. An overcurrent fault detection device according to claim 1, wherein:
    a cause of an overcurrent fault occurring in an electrical drive control system is determined, based upon a frequency of any of the phase current values exceeding the predetermined amplitude, which is detected by the decision-making circuit.

6. An overcurrent fault detection device according to claim 1, wherein:
    gate signals for transistors at the inverter are turned off so as to protect the transistors upon determining that an overcurrent has occurred.

7. An overcurrent fault detection device according to claim 1, wherein:
    the decision-making circuit further includes a hysteresis central value altering circuit that adjusts a hysteresis center assumed by the comparator with hysteresis in correspondence to a predetermined current value.

8. An overcurrent fault detection device according to claim 7, wherein:
the decision-making circuit further includes a sample hold; and
any of the phase current values held by the sample hold at a predetermined time interval is used as the predetermined current value.

9. An overcurrent fault detection device according to claim 7, wherein:
a command current value is used as the predetermined current value.

* * * * *